(12) United States Patent
Yu et al.

(10) Patent No.: US 12,119,303 B2
(45) Date of Patent: *Oct. 15, 2024

(54) PACKAGE STRUCTURE WITH REINFORCEMENT STRUCTURES IN A REDISTRIBUTION CIRCUIT STRUCTURE AND MANUFACTURING METHOD THEREOF

(71) Applicant: Taiwan Semiconductor Manufacturing Company, Ltd., Hsinchu (TW)

(72) Inventors: Chen-Hua Yu, Hsinchu (TW); Chun-Lin Lu, Hsinchu (TW); Han-Ping Pu, Taichung (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,769

(22) Filed: Aug. 2, 2023

(65) Prior Publication Data

US 2023/0378073 A1  Nov. 23, 2023

Related U.S. Application Data

(63) Continuation of application No. 17/728,919, filed on Apr. 25, 2022, now Pat. No. 11,824,005, which is a
(Continued)

(51) Int. Cl.
*H01L 23/538* (2006.01)
*H01L 21/56* (2006.01)
(Continued)

(52) U.S. Cl.
CPC .......... *H01L 23/5383* (2013.01); *H01L 21/56* (2013.01); *H01L 23/3121* (2013.01);
(Continued)

(58) Field of Classification Search
CPC ......... H01L 2224/0401; H01L 23/5383; H01L 23/3121; H01L 23/5283; H01L 23/5386;
(Continued)

(56) References Cited

U.S. PATENT DOCUMENTS 9,000,584 B2  4/2015  Lin et al.
9,048,222 B2  6/2015  Hung et al.
(Continued)

*Primary Examiner* — Alonzo Chambliss
(74) *Attorney, Agent, or Firm* — JCIPRNET

(57) ABSTRACT

A package structure includes an insulating encapsulation, at least one semiconductor die, a redistribution circuit structure, and first reinforcement structures. The at least one semiconductor die is encapsulated in the insulating encapsulation. The redistribution circuit structure is located on the insulating encapsulation and electrically connected to the at least one semiconductor die. The first reinforcement structures are embedded in the redistribution circuit structure. A shape of the package structure includes a polygonal shape on a vertical projection along a stacking direction of the insulating encapsulation and the redistribution circuit structure, and the first reinforcement structures are located on and extended along diagonal lines of the package structure.

20 Claims, 16 Drawing Sheets

Related U.S. Application Data continuation of application No. 17/031,906, filed on Sep. 25, 2020, now Pat. No. 11,342,269, which is a continuation of application No. 16/292,348, filed on Mar. 5, 2019, now Pat. No. 10,825,773.

(60) Provisional application No. 62/737,905, filed on Sep. 27, 2018.

(51) Int. Cl.
*H01L 23/00* (2006.01)
*H01L 23/31* (2006.01)
*H01L 23/522* (2006.01)
*H01L 23/528* (2006.01)
*H01L 25/18* (2023.01)

(52) U.S. Cl.
CPC ...... *H01L 23/5226* (2013.01); *H01L 23/5283* (2013.01); *H01L 23/5386* (2013.01); *H01L 24/09* (2013.01); *H01L 24/17* (2013.01); *H01L 24/19* (2013.01); *H01L 24/32* (2013.01); *H01L 24/73* (2013.01); *H01L 25/18* (2013.01); *H01L 2224/0231* (2013.01); *H01L 2224/02373* (2013.01); *H01L 2224/02375* (2013.01); *H01L 2224/02381* (2013.01); *H01L 2224/0401* (2013.01); *H01L 2224/73253* (2013.01); *H01L 2924/181* (2013.01)

(58) Field of Classification Search
CPC ......... H01L 24/17; H01L 24/32; H01L 24/73; H01L 24/19; H01L 25/18; H01L 21/56; H01L 2924/181
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,825,773 B2* | 11/2020 | Yu | H01L 24/32 |
| 11,824,005 B2* | 11/2023 | Yu | H01L 23/3128 |
| 2015/0014838 A1* | 1/2015 | Yap | H01L 24/14 |
| | | | 257/706 |

* cited by examiner

PACKAGE STRUCTURE WITH REINFORCEMENT STRUCTURES IN A REDISTRIBUTION CIRCUIT STRUCTURE AND MANUFACTURING METHOD THEREOF

CROSS-REFERENCE TO RELATED APPLICATION

This application is a continuation application of and claims the priority benefit of a prior U.S. application Ser. No. 17/728,919, filed on Apr. 25, 2022. The prior U.S. application Ser. No. 17/728,919 is a continuation application of and claims the priority benefit of a prior U.S. application Ser. No. 17/031,906, filed on Sep. 25, 2020. The prior U.S. application Ser. No. 17/031,906 is a continuation application of and claims the priority benefit of a prior U.S. application Ser. No. 16/292,348, filed on Mar. 5, 2019, now allowed, which claims the priority benefit of U.S. provisional application Ser. No. 62/737,905, filed on Sep. 27, 2018. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
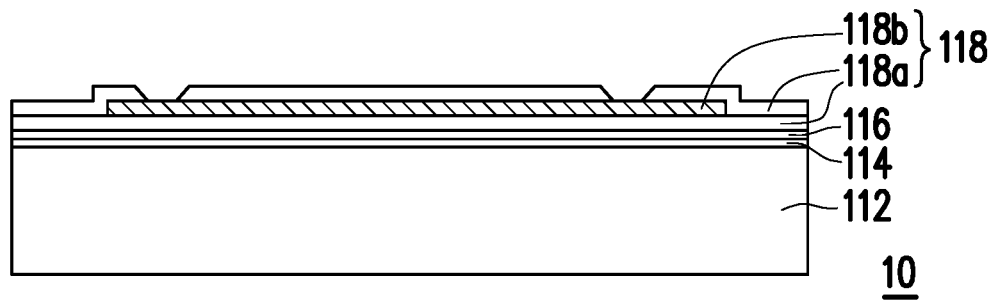
FIG. 1 to FIG. 10 are schematic cross sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross sectional views of various stages in a manufacturing method of a package structure according to some exemplary embodiments of the present disclosure. FIG. 11 is a schematic top view illustrating a relative position between antenna elements and a semiconductor die of a package structure according to some exemplary embodiments of the present disclosure, where FIG. 1 to FIG. 10 are the schematic cross sectional views taken along a cross sectional line I-I' depicted in FIG. 11. FIG. 12A, FIG. 13A, FIG. 14A, FIG. 15A, and FIG. 16A are schematic top views illustrating a relative position between first reinforcement structures and a semiconductor die of a package structure according to some exemplary embodiments of the present disclosure, where the first reinforcement structures are embedded in a back-side redistribution layer of the semiconductor die. FIG. 12B, FIG. 13B, FIG. 14B, FIG. 15B, and FIG. 16B are schematic top views illustrating a relative position between second reinforcement structures and a semiconductor die of a package structure according to some exemplary embodiments of the present disclosure, where the second reinforcement structures are embedded in a front-side redistribution layer of the semiconductor die.

In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 11, one (semiconductor) chip or die is shown to represent plural (semiconductor) chips or dies of the wafer, and a package structure 10 is shown to represent a package structure obtained following the manufacturing method, for example. In other embodiments, two (semiconductor) chips or dies are shown to represent plural (semiconductor) chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) or an adhesive layer (such as an ultra-violet curable adhesive or a heat curable adhesive layer).

In some embodiments, the buffer layer 116 is disposed on the debond layer 114, and the debond layer 114 is located between the carrier 112 and the buffer layer 116, as shown in FIG. 1. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity. However, the disclosure is not limited thereto; in an alternative embodiment, the buffer layer is optional and may be omitted.

Continued on FIG. 1, in some embodiments, a redistribution circuit structure 118 is formed over the carrier 112. For example, in FIG. 1, the redistribution circuit structure 118 is formed on the buffer layer 116, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the dielectric layers 118a and the metallization layers 118b included in the redistribution circuit structure 118 is not limited thereto, and may be designated and selected based on the demand. For example, the numbers of the dielectric layers 118a and the metallization layers 118b may be one or more than one.

In certain embodiments, the material of the dielectric layers 118a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the metallization layer 118b includes a conductive plate 50, a plurality of conductive traces 52, and a plurality of conductive traces 54 (see FIG. 12A, FIG. 14A and FIG. 15A), however the disclosure is not limited thereto. In some other embodiments, the metallization layer 118b includes a conductive plate 50, a plurality of conductive traces 52, a plurality of conductive traces 54, and at least one conductive trace 54' (see FIG. 13A and FIG. 16A), where the at least one conductive trace 54' includes a plurality of conductive traces 54'. In some embodiments, the conductive plate 50, the conductive traces 52, the conductive traces 54, and the conductive traces 54' are formed by patterning the at least one of the metallization layers 118b. The patterning step may include photolithography and etching processes, for example. The detailed structure of (the conductive plate 50, the conductive traces 52, the conductive traces 54, and the conductive traces 54' of) the metallization layer 118b will be elaborated in the descriptions of FIG. 12A, FIG. 13A, FIG. 14A, FIG. 15A, and FIG. 16A herein below.

Figure 2:
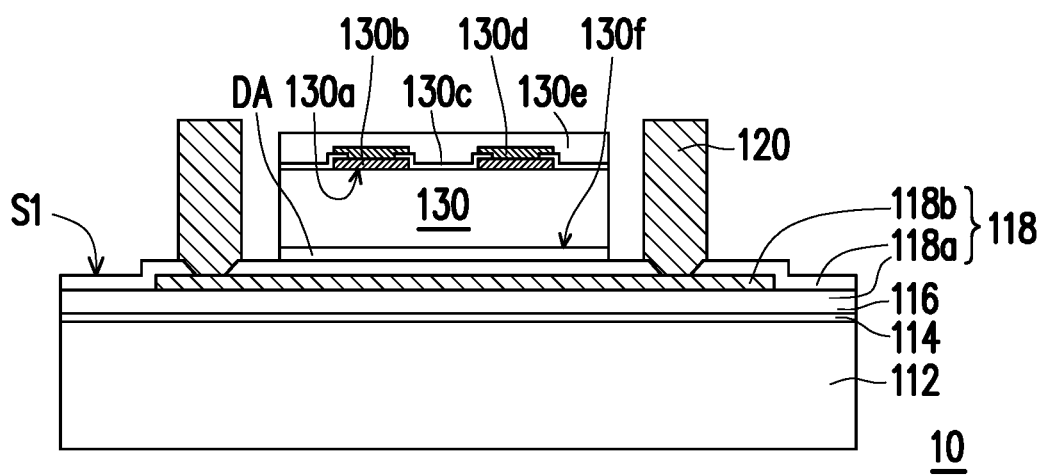

Referring to FIG. 2, in some embodiments, through vias 120 are formed on the redistribution circuit structure 118 (e.g. a first side S1 of the redistribution circuit structure 118). In some embodiments, the through vias 120 may be through integrated fan-out (InFO) vias. For simplification, only two through vias 120 are presented in FIG. 2 for illustrative purposes, however it should be noted that more than two through vias may be formed; the disclosure is not limited thereto. The number of the through vias 120 can be selected based on the demand.

In some embodiments, the through vias 120 are formed by photolithography, plating, photoresist stripping processes or any other suitable method. In one embodiment, the through vias 120 may be formed by forming a mask pattern (not shown) covering the redistribution circuit structure 118 with openings exposing the top surface of the metallization layer 118b exposed by the topmost layer of the dielectric layers 118a, forming a metallic material filling the openings to form the through vias 120 by electroplating or deposition and then removing the mask pattern. In one embodiment, the material of the through vias 120 may include a metal material such as copper or copper alloys, or the like. However, the disclosure is not limited thereto.

Continued on FIG. 2, in some embodiments, at least one semiconductor die 130 with a connecting film DA disposed thereon is provided, where the semiconductor die 130 has an active surface 130*a* and a backside surface 130*f* opposite to the active surface 130*a*. As shown in FIG. 2, the semiconductor die 130 is disposed on the redistribution circuit structure 118 (e.g. the first side S1 of the redistribution circuit structure 118) and over the carrier 112 through the connecting film DA. In some embodiments, the connecting film DA is located between the semiconductor die 130 and the redistribution circuit structure 118, and the connecting film DA is physically contacts the backside surface 130*f* of the semiconductor die 130 and the redistribution circuit structure 118 (e.g. the topmost layer of the dielectric layers 118*a* of the redistribution circuit structure 118). In some embodiments, due to the connecting film DA provided between the semiconductor die 130 and the redistribution circuit structure 118, the semiconductor die 130 and the redistribution circuit structure 118 are stably adhered to each other. In some embodiments, the connecting film DA may be, for example, a semiconductor die attach film, a layer made of adhesives or epoxy resin, or the like. In some embodiments, the redistribution circuit structure 118 is referred to as a back-side redistribution layer of the semiconductor die 130.

As shown in FIG. 2, for example, the through vias 120 are located aside of a location of the semiconductor die 130, and are mechanically and electrically connected to the metallization layer 118*b* of the redistribution circuit structure 118. In FIG. 2, a height of the through vias 120 is greater than a height of the at least one semiconductor die 130, for example; however, the disclosure is not limited thereto. In an alternative embodiment, the height of the through vias 120 may be less than or substantially equal to the height of the at least one semiconductor die 130. In one embodiment, the through vias 120 may be formed prior to the formation of the semiconductor die 130. In an alternative embodiment, the through vias 120 may be formed after the formation of the semiconductor die 130. The disclosure is not limited to the disclosure.

In some embodiments, as shown in FIG. 2, the semiconductor die 130 includes the active surface 130*a*, a plurality of pads 130*b* distributed on the active surface 130*a*, a passivation layer 130*c* covering the active surface 130*a* and a portion of the pad 130*b*, a plurality of conductive pillars 130*d* connected to the portion of the pads 130*b*, a protection layer 130*e* covering the pads 130*b* and the conductive pillars 130*d*, and the backside surface 130*f* opposite to the active surface 130*a*. The pads 130*b* are partially exposed by the passivation layer 130*c*, the conductive pillars 130*d* are disposed on and electrically connected to the pads 130*b*, and the protection layer 130*e* covers the passivation layer 130*c* and the conductive pillars 130*d*.

In some embodiments, the pads 130*b* may be aluminum pads or other suitable metal pads. In some embodiments, the conductive pillars 130*d* are copper pillars, copper alloy pillar or other suitable metal pillars, for example. In some embodiments, the passivation layer 130*c* and/or the protection layer 130*e* may be a polybenzoxazole (PBO) layer, a polyimide (PI) layer or other suitable polymers. In some alternative embodiments, the passivation layer 130*c* and/or the protection layer 130*e* may be made of inorganic materials, such as silicon oxide, silicon nitride, silicon oxynitride, or any suitable dielectric material. In certain embodiments, the materials of the passivation layer 130*c* and the protection layer 130*e* may be the same or different, the disclosure is not limited thereto.

In an alternative embodiment, the semiconductor die 130 may exclude the conductive pillars 130*d* and the protection layer 130*e*. For example, the semiconductor die 130 may include the pads 130*b* distributed on the active surface 130*a*, the passivation layer 130*c* covering the active surface 130*a* and a portion of the pad 130*b*, the backside surface 130*f* opposite to the active surface 130*a*. The disclosure is not limited thereto.

As shown in FIG. 2, only one semiconductor die is presented for illustrative purposes, however it should be noted that one or more semiconductor dies may be provided. In some embodiments, the semiconductor die 130 described herein may be referred to as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred to as a chip or a IC of combination-type, and the semiconductor die 130 may be a WiFi chip simultaneously including both of a RF chip and a digital chip. The disclosure is not limited thereto.

Figure 3:
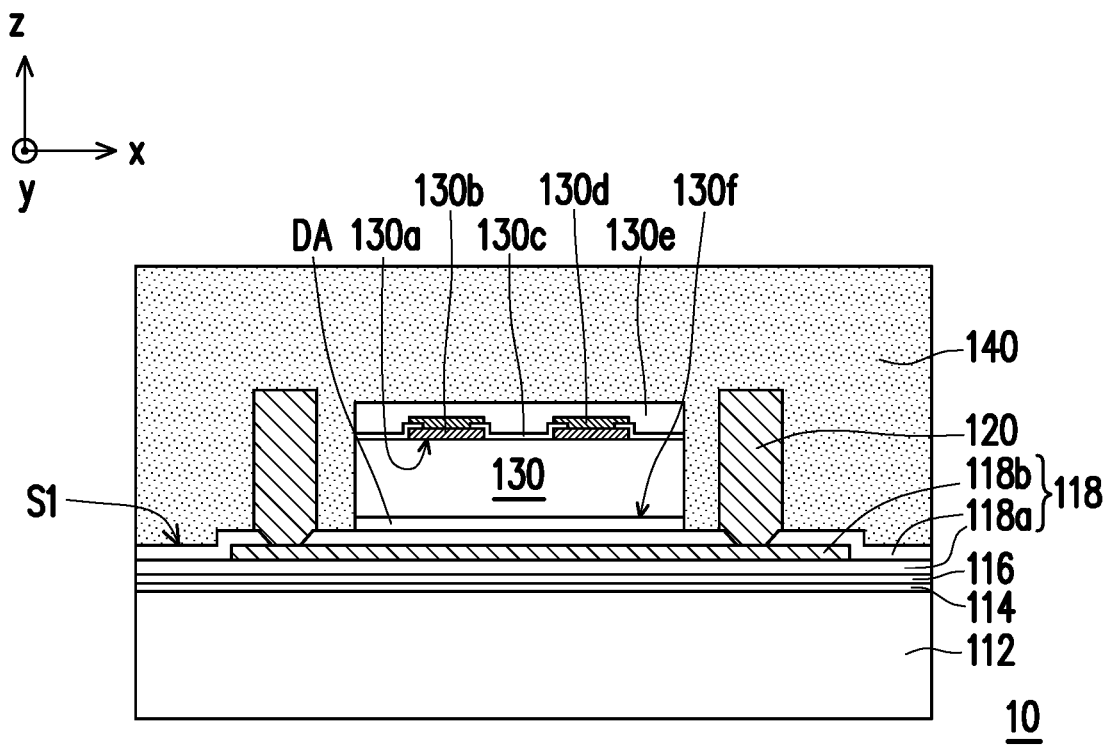

Referring to FIG. 3, in some embodiments, the through vias 120 and the semiconductor die 130 are encapsulated in an insulating encapsulation 140. In some embodiments, the insulating encapsulation 140 is formed on the redistribution circuit structure 118 and over the carrier 112. As shown in FIG. 3, the insulating encapsulation 140 at least fills up the gaps between the through vias 120 and between the through vias 120, the semiconductor die 130 and the connecting film DA. In some embodiments, the insulating encapsulation 140 covers the redistribution circuit structure 118 and the connecting film DA. In certain embodiments, as shown in FIG. 3, the through vias 120 and the semiconductor die 130 are not accessibly revealed by the insulating encapsulation 140.

Figure 4:
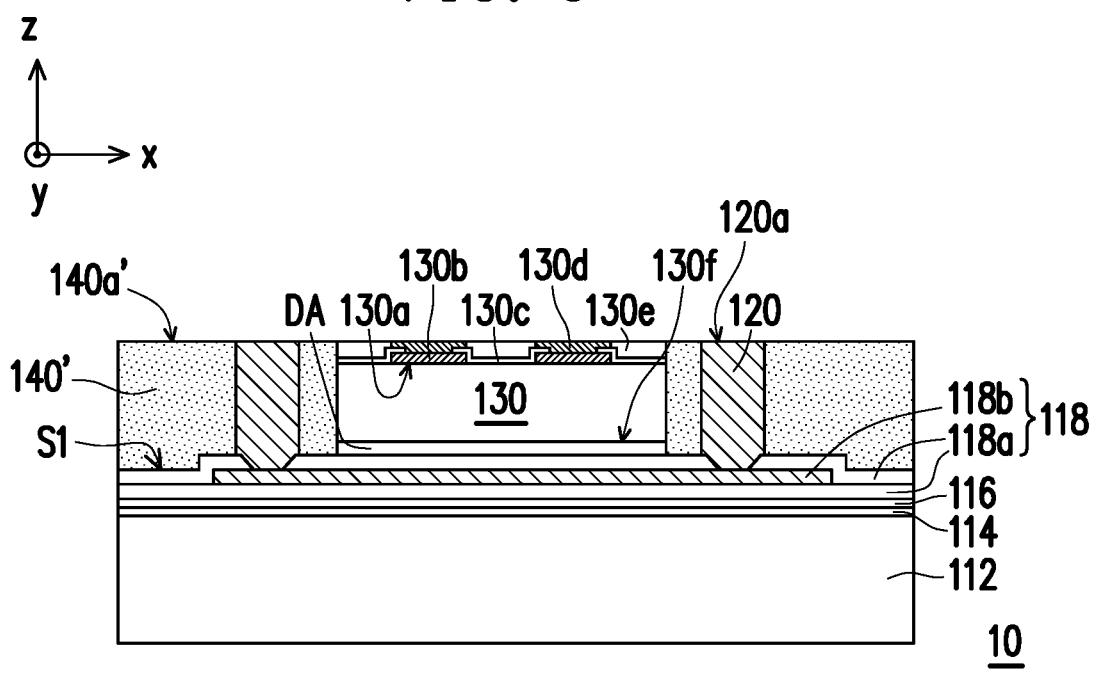

In some embodiments, the insulating encapsulation 140 covers the redistribution circuit structure 118 exposed from the through vias 120 and the semiconductor die 130. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto Referring to FIG. 4, in some embodiments, the insulating encapsulation 140 is planarized to form an insulating encapsulation 140' exposing the through vias 120 and the semiconductor die 130. In certain embodiments, as shown in FIG. 4, after the planarization, top surfaces 120a of the through vias 120 and top surfaces of the conductive pillars 130d and the protection layer 130e (of the semiconductor die 130) are exposed by a top surface 140a' of the insulating encapsulation 140'. That is, for example, the top surfaces of the conductive pillars 130d and the protection layer 130e of the semiconductor die 130 and the top surfaces 120a of the through vias 120 become substantially leveled with the top surface 140a' of the insulating encapsulation 140'. In other words, the top surfaces of the conductive pillars 130d and the protection layer 130e of the semiconductor die 130, the top surfaces 120a of the through vias 120, and the top surface 140a' of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of the semiconductor die 130 and the through vias 120 may also be planarized. In certain embodiments, the planarizing step may, for example, performed on the over-molded insulating encapsulation 140 to level the top surface 140a' of the insulating encapsulation 140', the top surfaces 120a of the through vias 120, and the top surfaces of the conductive pillars 130d and the protection layer 130e of the semiconductor die 130.

Figure 5:
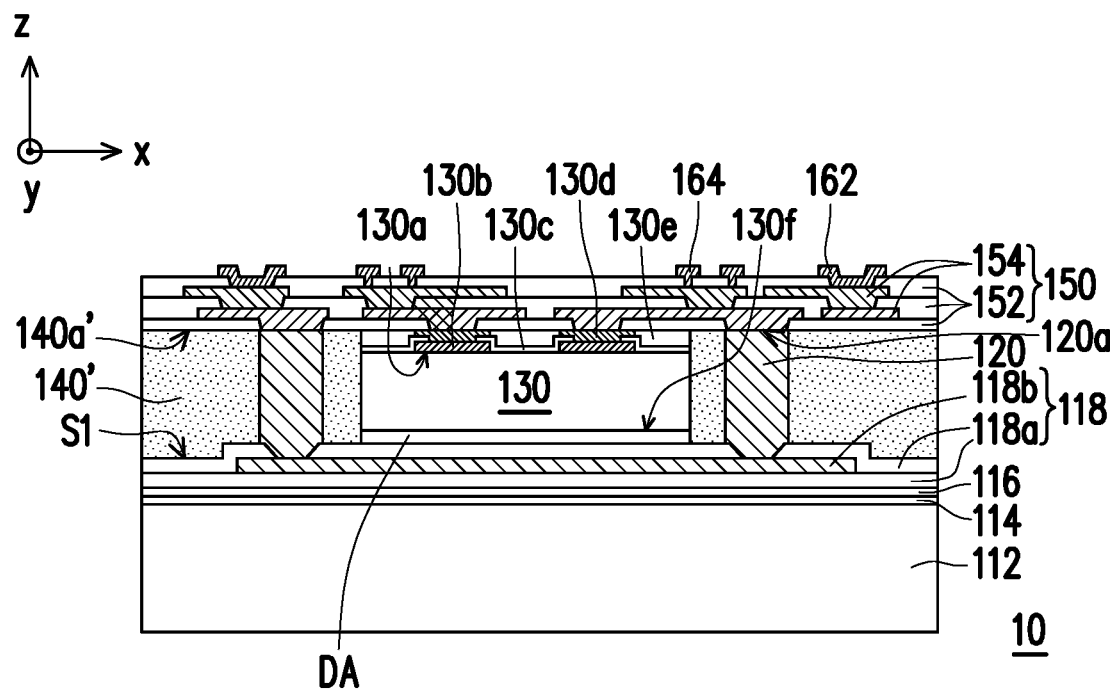

Referring to FIG. 5, in some embodiments, a redistribution circuit structure 150 is formed on the through vias 120, the semiconductor die 130 and the insulating encapsulation 140'. As shown in FIG. 5, the redistribution circuit structure 150 is formed on the top surfaces 120a of the through vias 120, the top surfaces of the conductive pillars 130d and the protection layer 130e of the semiconductor die 130 and the top surface 140a' of the insulating encapsulation 140'. In some embodiments, the redistribution circuit structure 150 is electrically connected to the through vias 120, and is electrically connected to the semiconductor die 130 through the conductive pillars 130d. In some embodiments, through the redistribution circuit structure 150, the semiconductor die 130 is electrically connected to the through vias 120. In some embodiments, through the redistribution circuit structure 150 and the through vias 120, the semiconductor die 130 is electrically connected to the redistribution circuit structure 118. As shown in FIG. 5, for example, the redistribution circuit structure 150 is referred to as a front-side redistribution layer of the semiconductor die 130. In some embodiments, as shown in FIG. 5, the semiconductor die 130 is directly located between the redistribution circuit structure 150 and the connecting film DA, where the through vias 120 and the insulating encapsulation 140' are directly located between the redistribution circuit structure 150 and the redistribution circuit structure 118.

In some embodiments, the formation of the redistribution circuit structure 150 includes sequentially forming one or more dielectric layers 152 and one or more metallization layers 154 in alternation. In certain embodiments, as shown in FIG. 5, the metallization layers 154 are sandwiched between the dielectric layers 152, where the top surface of a topmost layer of the metallization layers 154 is exposed by a topmost layer of the dielectric layers 152 and the bottom surface of a lowest layer of the metallization layers 154 is exposed by a lowest layer of the dielectric layers 152 to mechanically and electrically connect the through vias 120 and the conductive pillars 130d of the semiconductor die 130.

In some embodiments, the formation of the dielectric layers 152 may be the same as the formation of the dielectric layers 118as, and the formation of the metallization layers 154 may be the same as the formation of the metallization layer 118b, thus is not repeated herein. In an alternative embodiment, the material of the dielectric layers 152 may be the same as or different from the material of the dielectric layers 118a. In an alternative embodiment, the material of the metallization layers 154 may be the same as or different from the material of the metallization layer 118b. The disclosure is not limited thereto. It should be noted that the redistribution circuit structure 150 is not limited to include three dielectric layers and/or two metallization layers. For example, the numbers of the metallization layers and the dielectric layers may be one or more than two. As shown in FIG. 5, in some embodiments, the redistribution circuit structure 118, the through vias 120, and the redistribution circuit structure 150 provide a routing function for the semiconductor die 130.

In some embodiments, at least one of the metallization layers 154 includes a conductive plate 50, a plurality of conductive traces 52, a plurality of conductive traces 54, slits 56, and a conductive plate 58 (see FIG. 12B, FIG. 14B and FIG. 15B), however the disclosure is not limited thereto. In some other embodiments, the at least one of the metallization layers 154 includes a plurality of conductive traces 52, a plurality of conductive traces 54, at least one conductive trace 54', slits 56, and a conductive plate 58 (see FIG. 13B and FIG. 16B), where the at least one conductive trace 54' includes one or more than one conductive traces 54'. In some embodiments, the conductive traces 52, the conductive traces 54, the conductive traces 54', the slits 56, the conductive plate 58 are formed by patterning the at least one of the metallization layers 154. The patterning step may include photolithography and etching processes, for example. The detailed structure of (the conductive traces 52, the conductive traces 54, the conductive traces 54', the slits 56, the conductive plate 58 of) the at least one of the metallization layers 154 will be elaborated in the descriptions of FIG. 12B, FIG. 13B, FIG. 14B, FIG. 15B, and FIG. 16B herein below. In an alternative embodiment, all of the metallization layers 154 may have the structure depicted in FIG. 12B, FIG. 13B, FIG. 14B, FIG. 15B, and FIG. 16B.

Continued on FIG. 5, in some embodiments, a plurality of under-ball metallurgy (UBM) patterns 162 may be disposed on the exposed top surfaces of the topmost layer of the metallization layers 154 for electrically connecting with conductive elements (e.g. conductive balls), and/or at least one connection pad 164 may be disposed on the exposed top surfaces of the topmost layer of the metallization layers 154 for electrically connecting with at least one semiconductor elements (e.g., passive components or active components). As shown in FIG. 5, for example, the UBM patterns 162 and the connection pads 164 are formed on and electrically connected to the redistribution circuit structure 150. In some embodiments, the materials of the UBM patterns 162 and the connection pads 164 may include copper, nickel, titanium, tungsten, or alloys thereof or the like, and may be formed by an electroplating process, for example. In one embodiment, the material of the UBM patterns 162 may be the same as that of the connection pads 164. In another embodiment, the material of the UBM patterns 162 may be different from that of the connection pads 164. In one embodiment, there may be only the UBM patterns 162 presented in the package structure; however, in an alternative embodiment, there may be only the connection pads 164. The numbers of the UBM patterns 162 and the connection pad 164 are not limited in this disclosure, and may be selected based on the design layout.

Figure 6:
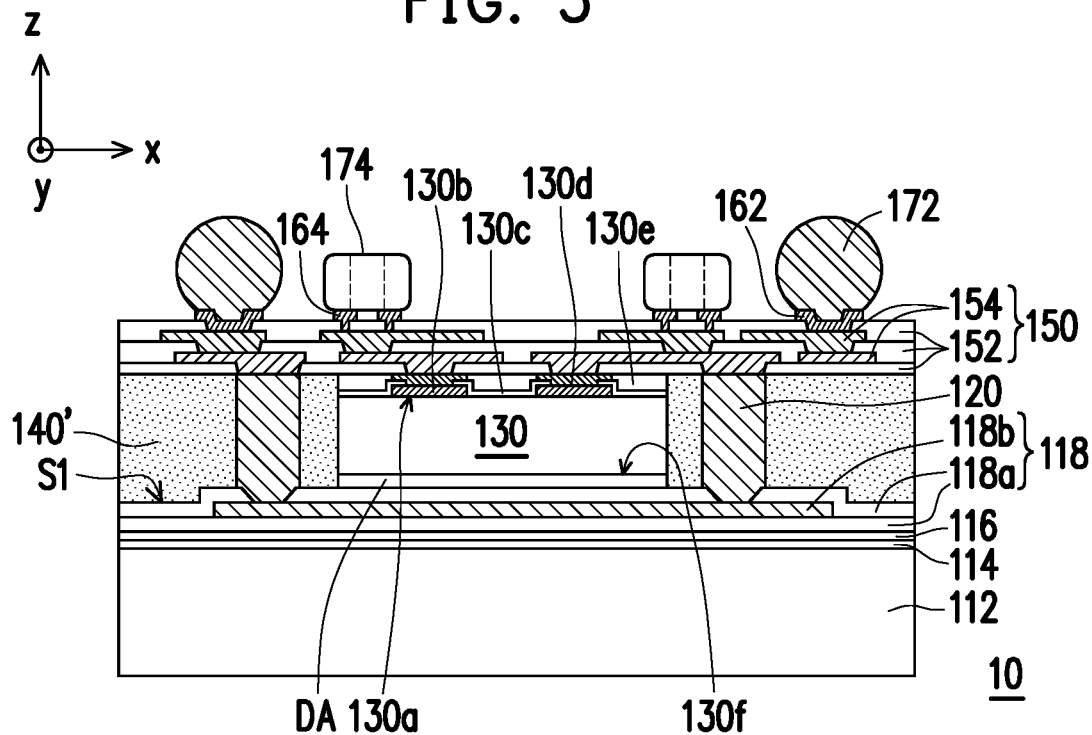

Referring to FIG. 6, in some embodiments, after the redistribution circuit structure 150 is formed, a plurality of conductive elements 172 are formed on the redistribution circuit structure 150. As shown in FIG. 6, the conductive elements 172 are disposed on the UBM patterns 162 over the redistribution circuit structure 150. In some embodiments, the conductive elements 172 may be disposed on the UBM patterns 162 by ball placement process or reflow process. In some embodiments, the conductive elements 172 are, for example, solder balls or ball grid array (BGA) balls. In some embodiments, the conductive elements 172 are connected to the redistribution circuit structure 150 through the UBM patterns 162. As shown in the FIG. 6, some of the conductive elements 172 are electrically connected to the semiconductor die 130 through the UBM patterns 162 and the redistribution circuit structure 150; some of the conductive elements 172 are electrically connected to the through vias 120 through the UBM patterns 162 and the redistribution circuit structure 150; and some of the conductive elements 172 are electrically connected to the redistribution circuit structure 118 through the UBM patterns 162, the redistribution circuit structure 150, and the through vias 120. The number of the conductive elements 172 is not limited to the disclosure, and may be designated and selected based on the number of the UBM patterns 162.

In some embodiments, at least one semiconductor die 174 is provided and disposed on the redistribution circuit structure 150. As shown in FIG. 6, the semiconductor die 174 is disposed on the connection pads 164, and is connected to the redistribution circuit structure 150 through the connection pads 164. In some embodiments, the semiconductor die 174 may be disposed on the connection pads 164 through reflow process. In some embodiments, the conductive elements 172 and the semiconductor die 174 are formed on a surface of the redistribution circuit structure 150, wherein the redistribution circuit structure 150 is located between the insulating encapsulation 140' and the conductive elements 172 and between the insulating encapsulation 140' and the semiconductor die 174. In some embodiments, as shown in FIG. 6, the semiconductor die 174 includes a surface mount device (e.g. a passive device, such as, capacitors, resistors, inductors, combinations thereof, or the like). The number of the semiconductor die 174 can be selected based on the number of the connection pad 164. In an alternative embodiment, the semiconductor die 174 may include surface mount devices of the same type or different types, the disclosure is not limited thereto. In alternative embodiments, the semiconductor die 174 are optional, and may be omitted.

Figure 7:
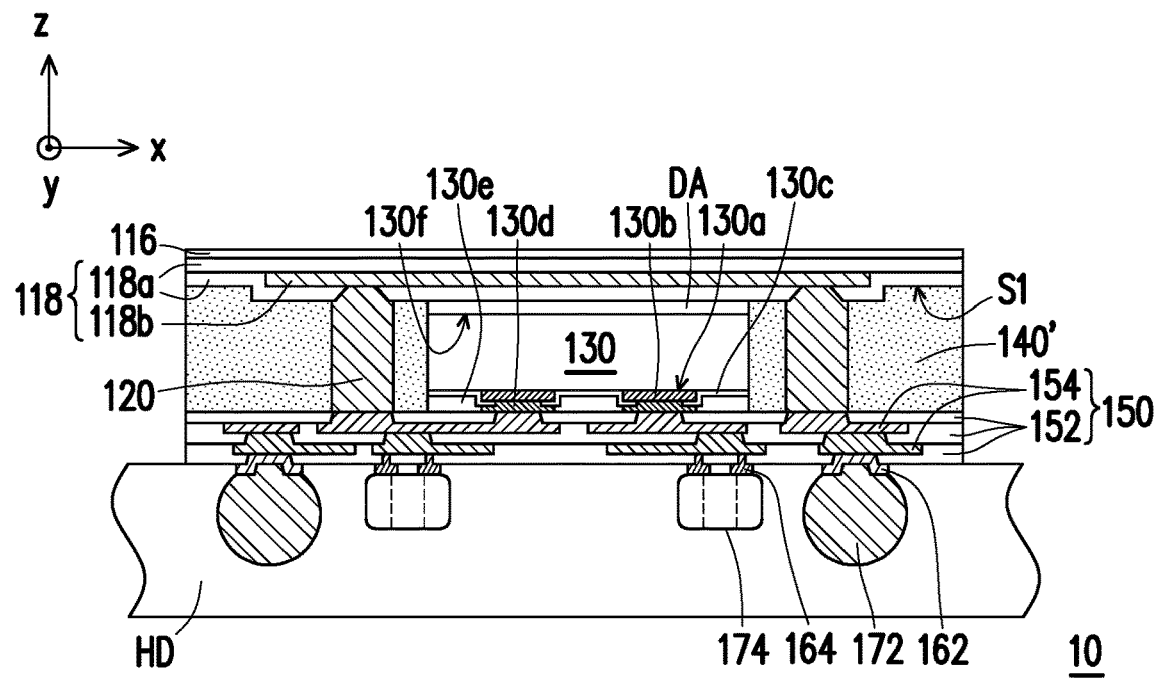

Referring to FIG. 7, in some embodiments, the whole package structure 10 along with the carrier 112 is flipped (turned upside down), where the conductive elements 172 and the semiconductor die 174 are placed to a holding device HD, and the carrier is then debonded from the buffer layer 116. In some embodiments, the holding device HD includes a polymer film, and the conductive elements 172 and the semiconductor die 174 are mounted into the polymer film as shown in FIG. 7. For example, the material of the polymer film may include a polymer film having sufficient elasticity to allow the conductive elements 172 and the semiconductor die 174 being embedded therein. In certain embodiments, the holding device HD may be a parafilm or a film made of other suitable soft polymer materials or the like. In an alternative embodiment, the holding device HD may be an adhesive tape, a carrier film or a suction pad. The disclosure is not limited thereto.

In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 7. In one embodiment, the debonding process is a laser debonding process. During the debonding step, the holding device HD is used to secure the package structures 10 before debonding the carrier 112 and the debond layer 114. In an alternative embodiment, the buffer layer 116 may be removed from the redistribution circuit structure 118 after debonding the carrier 112 and the debond layer 114.

Figure 8:
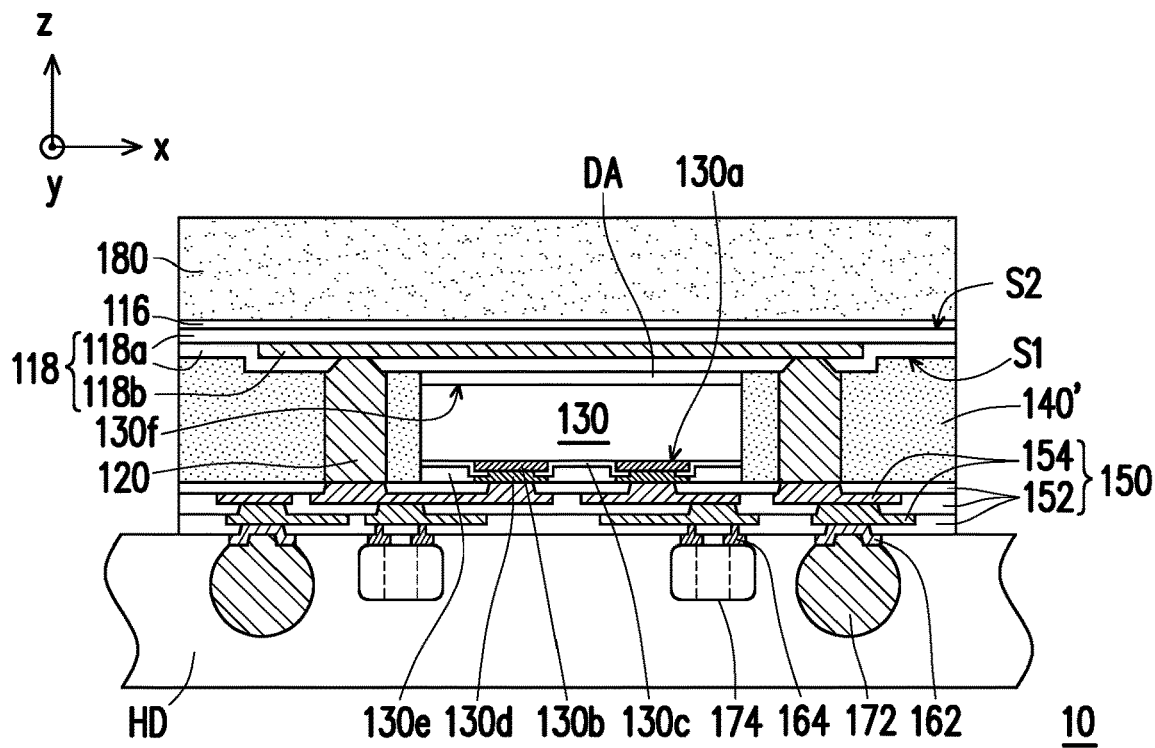

Referring to FIG. 8, in some embodiments, an encapsulant 180 is formed on the buffer layer 116 and over the redistribution circuit structure 118 (e.g. a second side S2 of the redistribution circuit structure 118), where the encapsulant 180 covers the buffer layer 116 and over the metallization layer 118b. As shown in FIG. 8, the encapsulant 180 is formed on a surface of the buffer layer 116 where is facing away from a second surface S2 of the redistribution circuit structure 118. In some embodiments, the buffer layer 116 is sandwiched between the encapsulant 180 and the redistribution circuit structure 118. In an alternative embodiment, prior to forming the encapsulant 180, the buffer layer 116 may be optionally removed.

In some embodiments, the encapsulant 180 includes epoxy resins or any other suitable type of molding materials. In some embodiments, the material of the encapsulant 180 has low permittivity (Dk) and low loss tangent (Df) properties. Depending on the frequency range of the high-speed applications, suitable materials of the encapsulant may be selected based on the required electrical properties of the package. In some embodiments, the material of the encapsulant 180 can be the same as the material of the insulating encapsulation 140. In an alternative embodiment, the material of the encapsulant 180 can be different from the material of the insulating encapsulation 140, the disclosure is not limited thereto.

Figure 9:
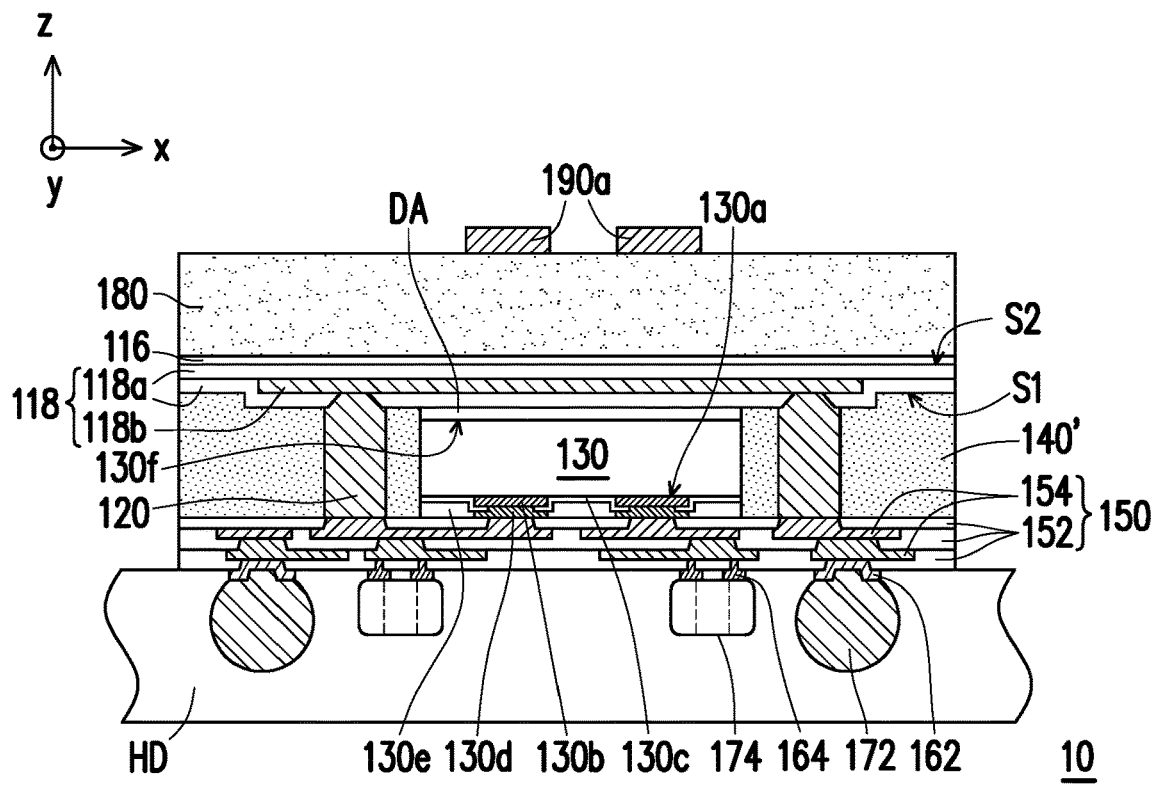

Referring to FIG. 9, in some embodiments, antenna elements 190a are formed on formed on the encapsulant 180, and over the buffer layer 116 and over the redistribution circuit structure 118 (e.g. the metallization layer 118b). The encapsulant 180 is located between the antenna elements 190a and the buffer layer 116. As shown in FIG. 9, the antenna elements 190a are formed on a surface of the encapsulant 180 facing away from the second surface S2 of the redistribution circuit structure 118. In some embodiments, the antenna elements 190a are electrically coupled with the metallization layer 118b of the redistribution circuit structure 118, where the metallization layer 118b overlapped with the antenna elements 190a serves as a ground plate and a feed-line for the antenna elements 190a. In some embodiments, a portion of the metallization layer 118b overlapped with the antenna elements 190a is referred to as the ground plate while another portion of the metallization layer 118b is referred to as the feed-line of the antenna elements 190a for transmitting electric signals from the semiconductor die 130 to the antenna elements 190a or from antenna elements 190a to the semiconductor die 130.

In some embodiments, the antenna elements 190a are formed by forming a metallization layer (not shown) by electroplating or deposition over the encapsulant 180 and then patterning the metallization layer by photolithographic and etching processes. In an alternative embodiment, the antenna elements 190a are formed by forming a metallization layer (not shown) by plating process. In a further alternative embodiment, the antenna elements 190a are formed by forming a metallization layer (not shown) by lamination or the like. In some embodiments, the material of the antenna elements 190a include aluminum, titanium, copper, nickel, tungsten, and/or alloys thereof. In some embodiments, the antenna elements 190a are arranged in form of a matrix, such as the N×N array or N×M arrays (N, M>0, N may or may not be equal to M). As shown in FIG. 9 and FIG. 11, in some embodiments, the package structure 10 includes the antenna elements 190a arranged in form of an array, such as a 2×2 array, however, the disclosure is not limited thereto. The size of the array for antenna elements 190a can be designated and selected based on the demand. In some embodiments, the antenna elements 190a are located on and overlapped with the metallization layer 118b, the connecting film DA, and the die 130. In some embodiments, the antenna elements 190a and the corresponding portions of the metallization layer 118b are referred to as antennas ATN1 (see FIG. 11), which may include patch antennas.

Figure 10:
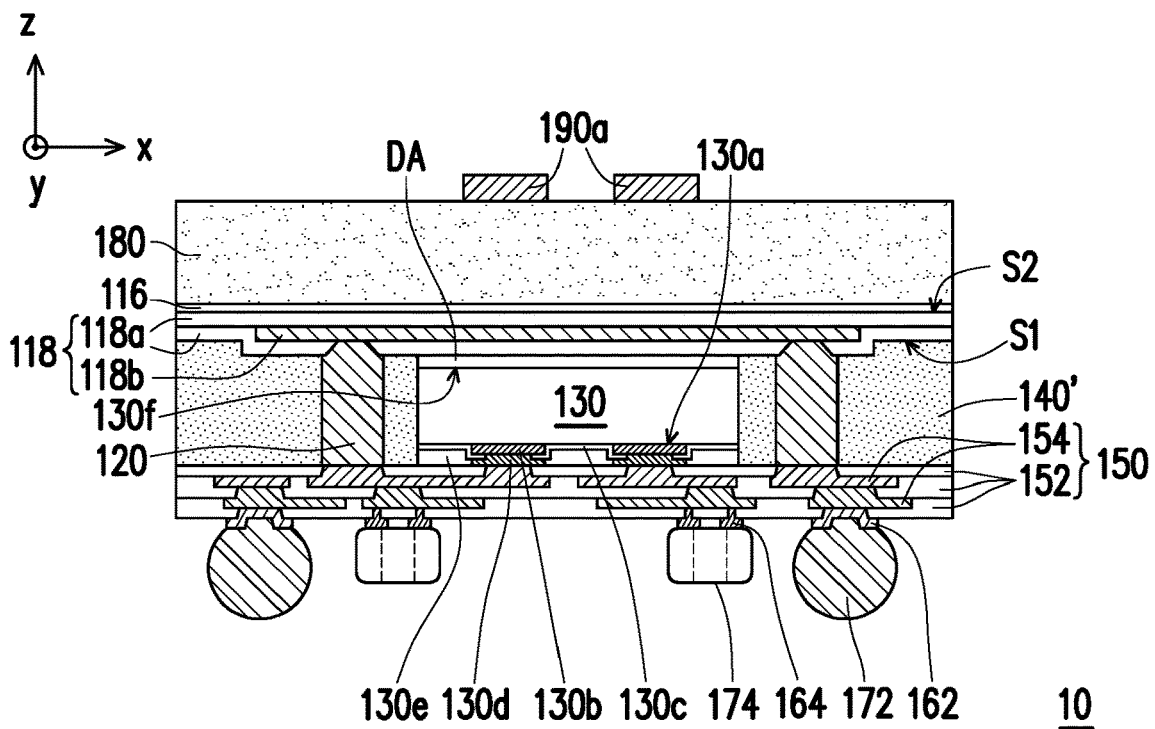
Figure 11:
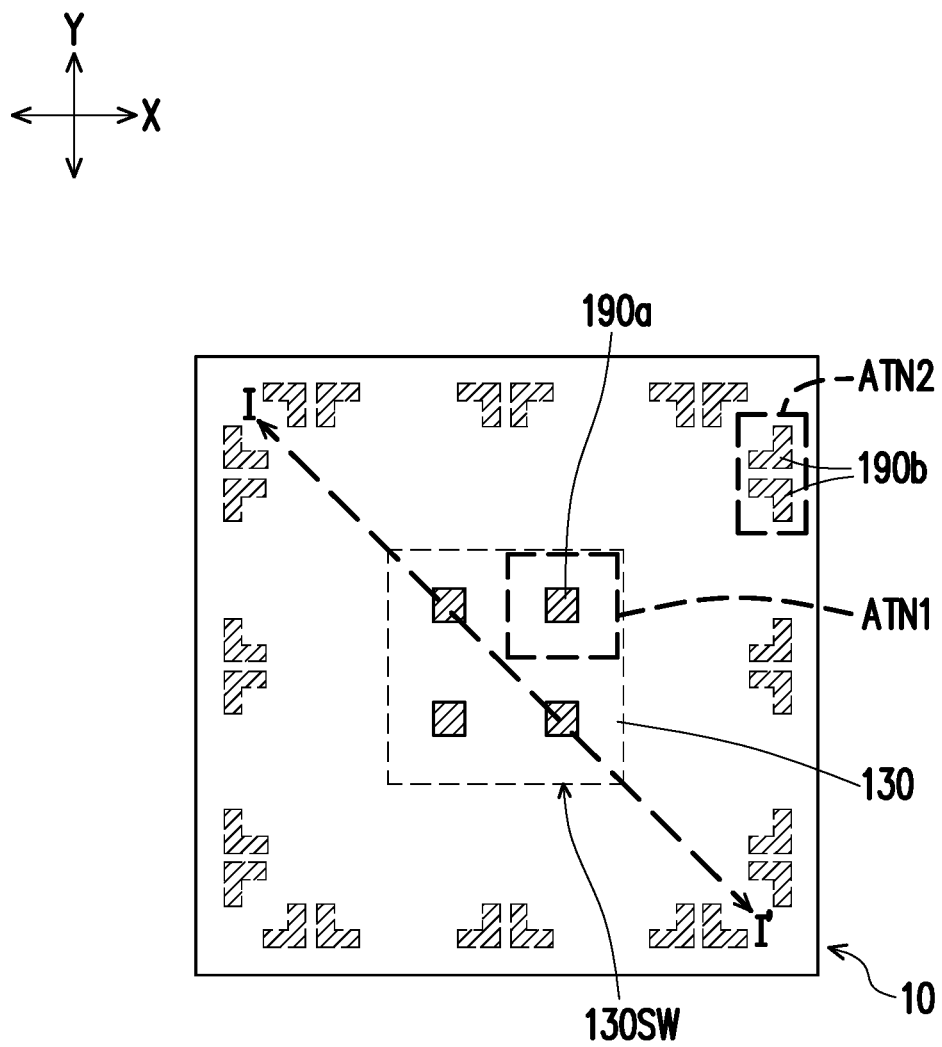
FIG. 11 is a schematic top view illustrating a relative position between antenna elements and a semiconductor die of a package structure according to some exemplary embodiments of the present disclosure.

Referring to FIG. 10, in some embodiments, the conductive elements 172 and the semiconductor die 174 are released from the holding device HD to form the package structure 10, and the redistribution circuit structure 150, the conductive elements 172 and the semiconductor die 174 are exposed. In some embodiments, a dicing process is performed to cut the wafer having a plurality of the package structures 10 into individual and separated package structures 10 before releasing the conductive elements 172 and the semiconductor die 174 from the holding device HD. In one embodiment, the dicing process is a wafer dicing process including mechanical blade sawing or laser cutting. Up to here, the manufacture of the package structure 10 is completed.

In some embodiments, the package structure 10 may be further mounted with an additional package, chips/dies or other electronic devices to form a stacked package structure. For example, the package structure 10 may be further mounted with an additional package, chips/dies or other electronic devices to form the POP structure through the conductive elements 172 and/or other additional connectors based on the demand.

Referring to FIG. 11, in an alternative embodiment, the package structure 10 further includes one or more antennas ATN2. In some embodiments, each of the antennas ATN2 is constituted by two of through vias 190b located aside of the semiconductor die 130 and the through vias 120 and encapsulated in the insulating encapsulation 140 and corresponding portions of the redistribution circuit structure 118 and/or the redistribution circuit structure 150 that are electrically connected to the two through vias 190b. The through vias 190b are arranged along the edges of the package structure 10 (see FIG. 11). In one embodiment, for the two through vias 190b in each antenna ATN2, one through via 190b is electrically connected to a part of the redistribution circuit structure 118 or a part of the redistribution circuit structure 150 (one of which serves as a feed line of the antenna ATN2); and the other through via 190b, which is electrically connected to the other one of a part of the redistribution circuit structure 118 or a part of the redistribution circuit structure 150 and is electrically grounded, serves as a ground plate/line of the antenna ATN2. In other words, the antennas ATN2 are electrically connected to the semiconductor die 130 through the redistribution circuit structure 118 and/or the redistribution circuit structure 150. For example, as shown in FIG. 11, the antennas ATN2 are referred as end-fire radiation antennas of horizontal polarization (e.g. the electromagnetic wave emitted by the end-fire radiation antennas polarizing in a direction X or a direction Y) or vertical polarization (e.g. the electromagnetic wave emitted by the end-fire radiation antennas polarizing in a direction Z). In some embodiments, the antennas ATN2 include dipole antennas of horizontal polarization or vertical polarization.

In some embodiments, the forming method and material of the through vias 190b are similar to the forming method and material of the through vias 120, and thus is not be repeated herein. In one embodiment, the through vias 190b and the through vias 120 are formed in the same processing step. In an alternative embodiment, the through vias 190b and the through vias 120 are formed in different processing steps. The disclosure is not limited thereto. The arrangement and numbers of the antennas ATN2 may be adjusted by the demand, the disclosure is not limited to what is illustrated in FIG. 11. Furthermore, owing to the configuration of the antennas ATN1 and the antennas ATN2, a coverage range of the electromagnetic waves in the package structure 10 is increased, and thus the efficiency of the antenna application of the package structure 10 is enhanced.

Referring to FIG. 12A to FIG. 16A and FIG. 12B to FIG. 16B, in some embodiments, in the top views (e.g. a X-Y plane) taken on a vertical projection along a stacking direction (e.g. the direction Z) of the carrier 112 and the redistribution circuit structure 118, the shapes of the package structure 10 and the semiconductor die 130 are square, however the disclosure is not limited thereto. In one embodiment, the shape of the package structure 10 may be different from the shape of the semiconductor die 130. In certain embodiments, the shapes of the package structure 10 and the semiconductor die 130 may be tetragonal (e.g. rectangular), hexagonal, octagonal or any suitable polygonal shape. In one embodiment, as shown in the top views of FIG. 12A, FIG. 12B, FIG. 13A and FIG. 13A, extending directions of diagonal lines DL1, DL2 of the package structure 10 are the same as a respective one of extending directions of diagonal lines (not labeled) of the semiconductor die 130. In other words, the diagonal lines DL1, DL2 of the package structure 10 are respectively aligned with the diagonal lines of the semiconductor die 130, however the disclosure is not limited thereto. In an alternative embodiment, as shown in the top views of FIG. 14A, FIG. 14B, FIG. 15A, FIG. 15B, FIG. 16A and FIG. 16B, the extending directions of the diagonal lines DL1, DL2 of the package structure 10 are different from the extending directions of the diagonal lines DL3, DL4 of the semiconductor die 130. In other words, the diagonal lines DL1, DL2 of the package structure 10 are tilted away from the diagonal lines DL3, DL4 of the semiconductor die 130.

As shown in FIG. 12A, FIG. 13A, FIG. 14A, FIG. 15A, and FIG. 16A, in certain embodiments, the metallization layer 118b of the redistribution circuit structure 118 includes the conductive plate 50, the conductive traces 52, the conductive traces 54, and/or the conductive traces 54'.

In some embodiments, the conductive plate 50 is overlapped with the semiconductor die 130, and is physically connected to the conductive traces 54. In one embodiment, the conductive plate 50 may be physically connected to the conductive traces 54 and the conductive traces 54'. In a further embodiment, the conductive plate 50 may be physically connected to the conductive traces 52, the conductive traces 54 and the conductive traces 54'. In certain embodiments, the shape of the conductive plate 50 may be tetragonal (e.g. rectangular), hexagonal, octagonal or any suitable polygonal shape, the disclosure is not limited thereto. For example, the shape of the conductive plate 50 is square, and is the same as the shapes of the package structure 10 and the semiconductor die 130, as shown in FIG. 12A, FIG. 13A, FIG. 14A, FIG. 15A, and FIG. 16A. However, the disclosure is not limited thereto, the shape of the conductive plate 50 may be different from the shapes of the package structure 10 and the semiconductor die 130, in some other embodiments.

In some embodiments, as shown in FIG. 12A, FIG. 13A, FIG. 14A, FIG. 15A, and FIG. 16A, each of the conductive traces 52 of the redistribution circuit structure 118 includes a conductive pad P1, a conductive pad P2 and a connecting structure C1 physically connected the conductive pad P1 and the conductive pad P2, where the conductive pad P1 is electrically connected to the conductive pad P2 through the connecting structure C1. In one embodiment, the size of each conductive pad P1 is greater than the size of each conductive pad P2, however the disclose is not limited thereto. In an alternative embodiment (not shown), the size of each conductive pad P1 is substantially equal to the size of each conductive pad P2. In some embodiments, the shape of each of the conductive pads P1 and the conductive pads P2 may include a round, elliptical, oval, tetragonal, octagonal or any suitable polygonal shape. In some embodiments, the shapes of the conductive pads P1 and the conductive pads P2 may be the same or different from each other or may be partially the same or partially different from each other, the disclosure is not limited thereto. In certain embodiments, a set of the connecting structures C1 are liner conductive strips, and other set of the connecting structures C1 are curved conductive strips with one or more than one bending portions, however the disclosure may not be limited thereto. In one embodiment, the connecting structures C1 may all be liner conductive strips or may all be curved conductive strips with one or more than one bending portions. In some embodiments, the connecting structures C1 has a width W1 and a length L1, where the length L1 is about 50 μm or above.

In some embodiments, as shown in FIG. 12A, FIG. 13A, FIG. 14A, FIG. 15A, and FIG. 16A, each of the conductive traces 54 of the redistribution circuit structure 118 includes a conductive pad P3, a conductive pad P4 and a connecting structure C2 physically connected the conductive pad P3 and the conductive pad P4, where the conductive pad P3 is electrically connected to the conductive pad P4 through the connecting structure C2. In one embodiment, the size of each conductive pad P3 is greater than the size of each conductive pad P4, however the disclose is not limited thereto. In an alternative embodiment (not shown), the size of each conductive pad P3 is substantially equal to the size of each conductive pad P4. In some embodiments, the shape of each of the conductive pads P3 and the conductive pads P4 may include a round, elliptical, oval, tetragonal, octagonal or any suitable polygonal shape. In some embodiments, the shapes of the conductive pads P3 and the conductive pads P4 may be the same or different from each other or may be partially the same or partially different from each other, the disclosure is not limited thereto. In certain embodiments, a set of the connecting structures C2 are liner conductive strips, and other set of the connecting structures C2 are curved conductive strips with one or more than one bending portions, however the disclosure may not be limited thereto. In one embodiment, the connecting structures C2 may all be liner conductive strips or may all be curved conductive strips with one or more than one bending portions. In some embodiments, a ratio of a width W2 of the connecting structures C2 to the width W1 of the connecting structures C1 is about 2:1 to 5:1, and a length L2 of the connecting structures C2 is about 50 μm or above. In the disclosure, the width W2 of the connecting structures C2 is greater than the width W1 of the connecting structures C1, the connecting structures C2 are referred to as reinforcement structures C2.

Figure 12A:
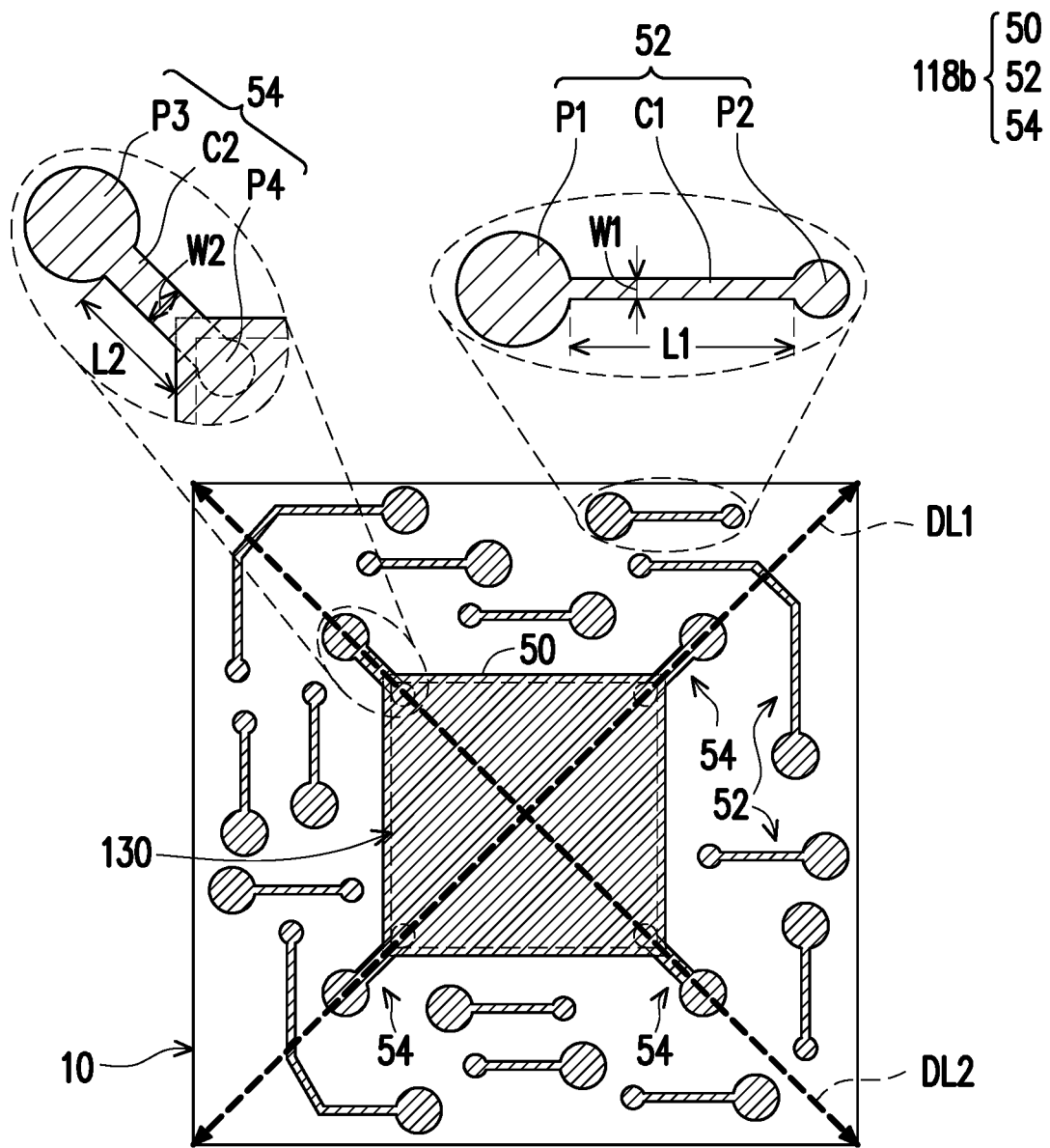
FIG. 12A, FIG. 13A, FIG. 14A, FIG. 15A, and FIG. 16A are schematic top views illustrating a relative position between first reinforcement structures and a semiconductor die of a package structure according to some exemplary embodiments of the present disclosure.
Figure 13A:
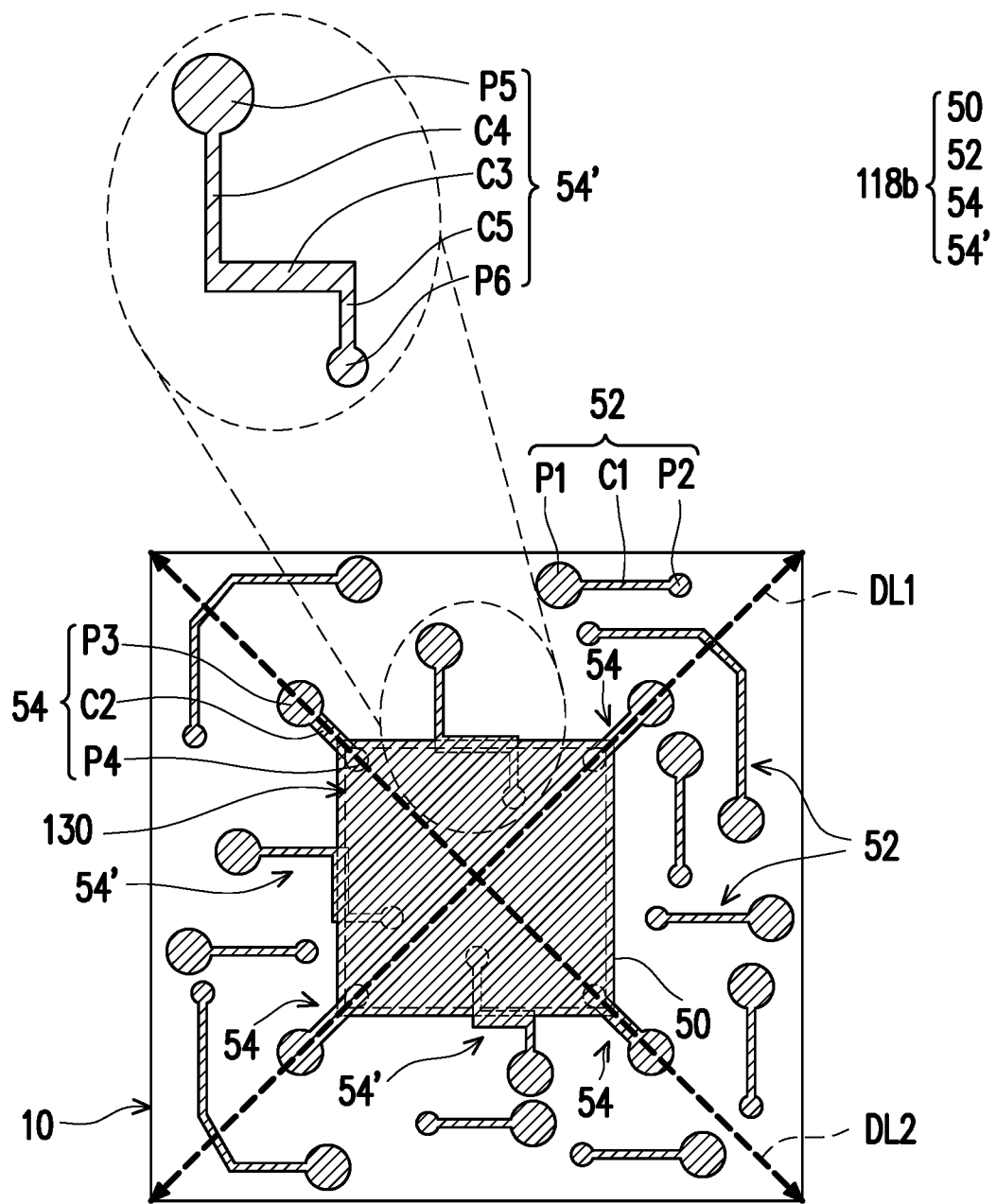
Figure 14A:
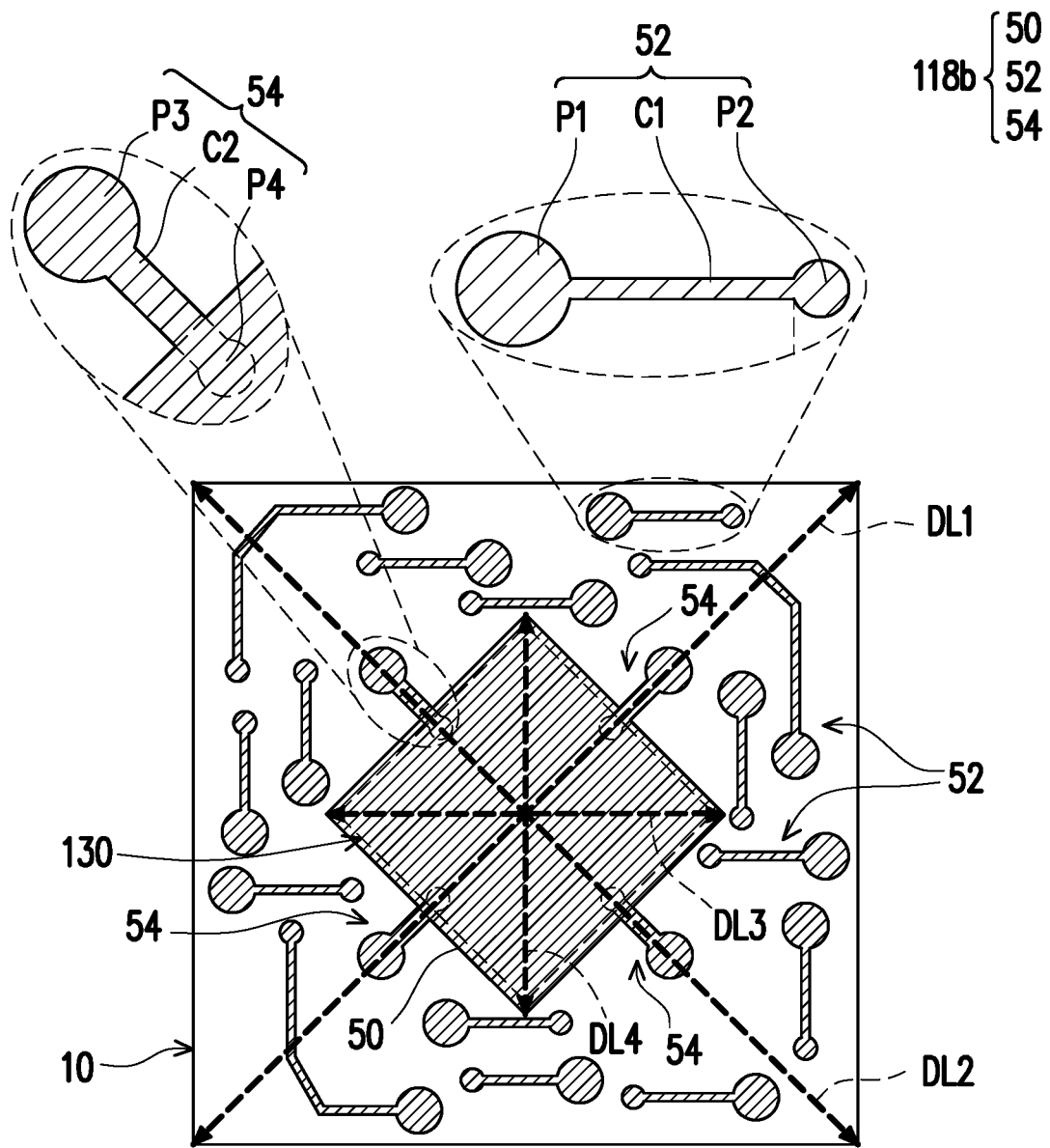
Figure 15A:
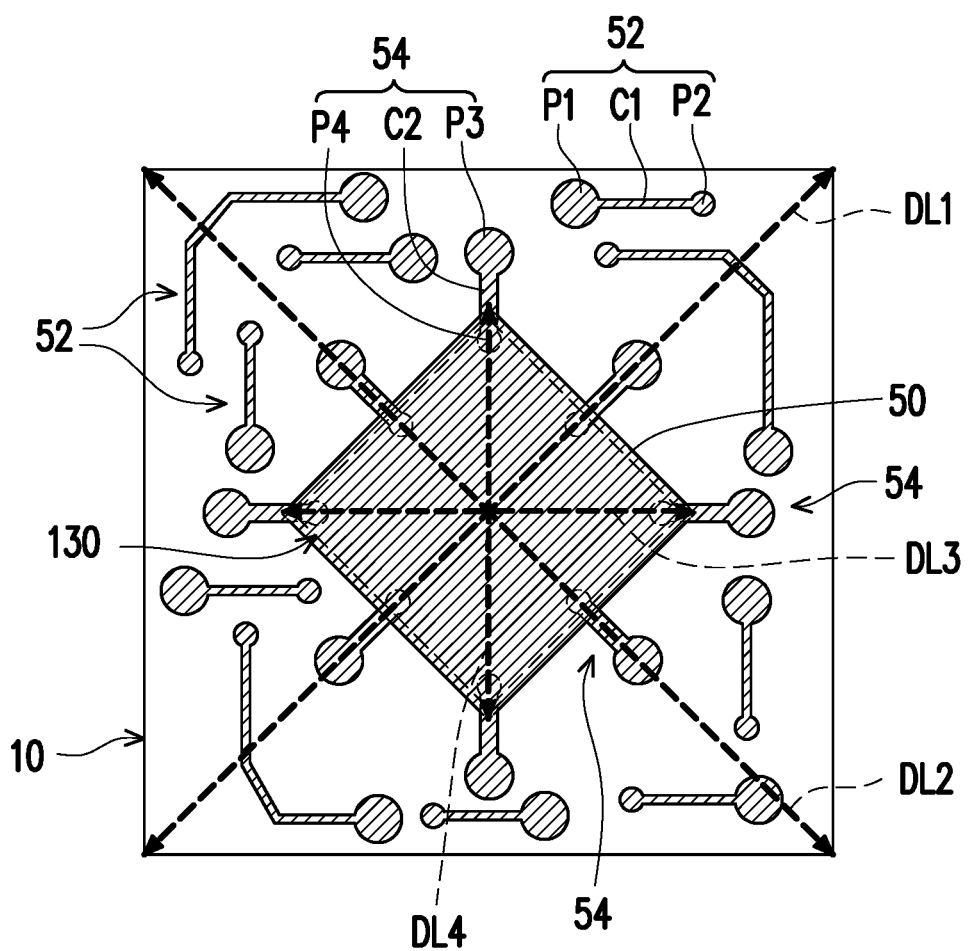
Figure 16A:
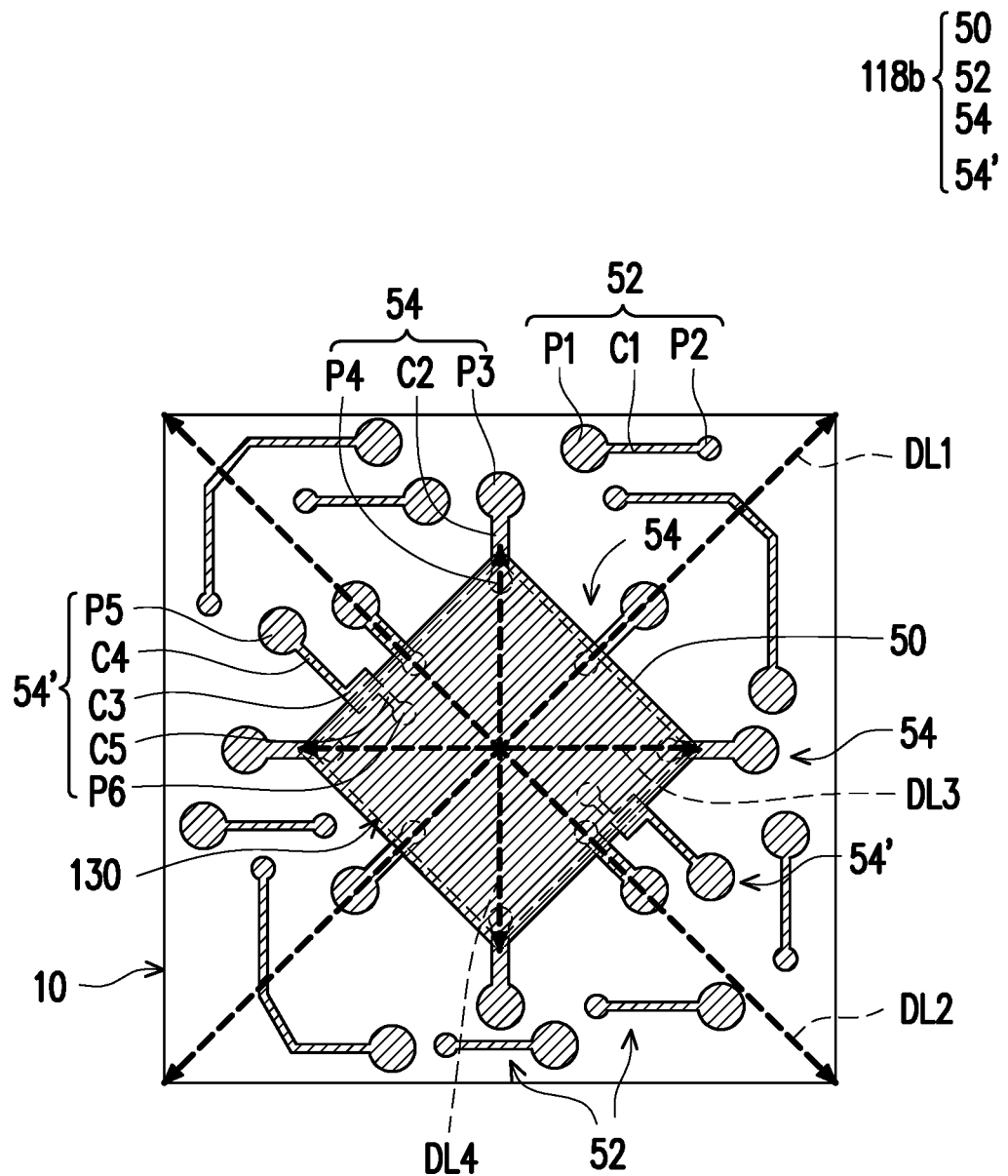

For example, as shown in FIG. 12A and FIG. 13A which the diagonal lines DL1, DL2 of the package structure 10 are respectively aligned with the diagonal lines (not labeled) of the semiconductor die 130, the conductive traces 54 are located on the diagonal lines DL1, DL2 of the package structure 10 and the respective one of the diagonal lines (not labeled) of the semiconductor die 130. For another example, as shown in FIG. 14A, FIG. 15A, and FIG. 16A which the diagonal lines DL1, DL2 of the package structure 10 are not aligned with the diagonal lines DL3, DL4 of the semiconductor die 130, some of the conductive traces 54 are located on the diagonal lines DL1, DL2 of the package structure 10 and some of the conductive traces 54 are located on the diagonal lines DL3, DL4 of the semiconductor die 130. In some embodiments, the connecting structures C2 of the conductive traces 54 extend along the diagonal lines DL1, DL2 of the package structure 10 and/or the diagonal lines DL3, DL4 of the semiconductor die 130. In some embodiments, the connecting structures C2 extend from the semiconductor die 130 to the insulating encapsulation 140'. In other words, the connecting structures C2 are at least located on an interface of the semiconductor die 130 and the insulating encapsulation 140'. In an alternative embodiment, some of the conductive traces 54 may be located on edges of the semiconductor die 130 and across the interface of the semiconductor die 130 and the insulating encapsulation 140', where the connecting structure C2 thereof are not extending along the diagonal lines DL3, DL4 of the semiconductor die 130.

In some embodiments, as shown in FIG. 13A and FIG. 16A, each of the conductive traces 54' of the redistribution circuit structure 118 includes a conductive pad P5, a conductive pad P6, a connecting structure C3, a connecting structure C4, and a connecting structure C5, where the connecting structure C3 is physically connected to the conductive pad P5 through the connecting structure C4 and is physically connected to the conductive pad P6 through the connecting structure C5, where the conductive pad P5 is electrically connected to the conductive pad P6 through the connecting structures C3~C5. In one embodiment, the size of each conductive pad P5 is greater than the size of each conductive pad P6, however the disclose is not limited thereto. In an alternative embodiment (not shown), the size of each conductive pad P5 is substantially equal to the size of each conductive pad P6. In some embodiments, the shape of each of the conductive pads P5 and the conductive pads P6 may include a round, elliptical, oval, tetragonal, octagonal or any suitable polygonal shape. In some embodiments, the shapes of the conductive pads P5 and the conductive pads P6 may be the same or different from each other or may be partially the same or partially different from each other, the disclosure is not limited thereto. In certain embodiments, a set of the connecting structures C3, the connecting structures C4 and/or the connecting structures C5 are liner conductive strips, and other set of the connecting structures C3, the connecting structures C4 and/or the connecting structures C5 are curved conductive strips with one or more than one bending portions, however the disclosure may not be limited thereto. In one embodiment, the connecting structures C3, the connecting structures C4 and/or the connecting structures C5 may all be liner conductive strips or may all be curved conductive strips with one or more than one bending portions. In some embodiments, widths and lengths of the connecting structures C4, C5 are the same as the width W1 and the length L1 of the connecting structures C1, and thus are not repeated herein. In some embodiments, a ratio of a width W3 of the connecting structures C3 to the width W1 of the connecting structures C1 is about 2:1 to 5:1, and a length L3 of the connecting structures C3 is about 50 µm or above. In the disclosure, the width W3 of the connecting structures C3 is greater than the width W1 of the connecting structures C1, the connecting structures C3 are referred to as reinforcement structures.

For a further example, as shown in FIG. 13A and FIG. 16A, each of the conductive traces 54' is located on the edges of the semiconductor die 130 and across the interface of the semiconductor die 130 and the insulating encapsulation 140', where the connecting structures C3 of the conductive traces 54' are extending along the edges of the semiconductor die 130. In some embodiments, the connecting structures C3 are overlapped with the semiconductor die 130 and the insulating encapsulation 140'. In other words, the connecting structures C3 are at least located on an interface of the semiconductor die 130 and the insulating encapsulation 140'. Due to the connecting structures C2 and connecting structures C3, the stress applied to the conductive traces of the metallization layer 118b is suppressed, thereby the reliability of the package structure 10 is achieved, and thus the available area for routing design of the package structure 10 is increased. In some embodiments, the conductive pads P1-P6 are referred to as contact pads, where the contact pads are connected to one connector underneath or overlaying thereon. Here, the afore-said connector may be a conductive pillar/vial/plug, a conductive element/connector (such as a conductive ball), or the like.

As shown in FIG. 12B, FIG. 13B, FIG. 14B, FIG. 15B, and FIG. 16B, for example, at least one of the metallization layers 154 of the redistribution circuit structure 150 includes the conductive traces 52, the conductive traces 54, the slits 56, the conductive plate 58, and/or the conductive traces 54'. The elements similar to or substantially the same as the elements described above will use the same reference numbers, and certain details or descriptions of the same elements and the relationship thereof (e.g. the relative positioning configuration and electrical connection) will not be repeated herein.

In some embodiments, as shown in FIG. 12B, FIG. 13B, FIG. 14B, FIG. 15B, and FIG. 16B, for the redistribution circuit structure 150, the conductive plate 58 is a patterned conductive plate, where the conductive plate 58 is overlapped with the semiconductor die 130 and is separated from the conductive traces 52, the conductive traces 54 and the conductive traces 54' through the slits 56. In one embodiment, thicknesses of the slits 56 are the same, however, the disclosure is not limited thereto. In an alternative embodiment, the thicknesses of the slits 56 are different. The shape of the conductive plate 50 may be different from the shapes of the package structure 10 and the semiconductor die 130, in some other embodiments.

Figure 12B:
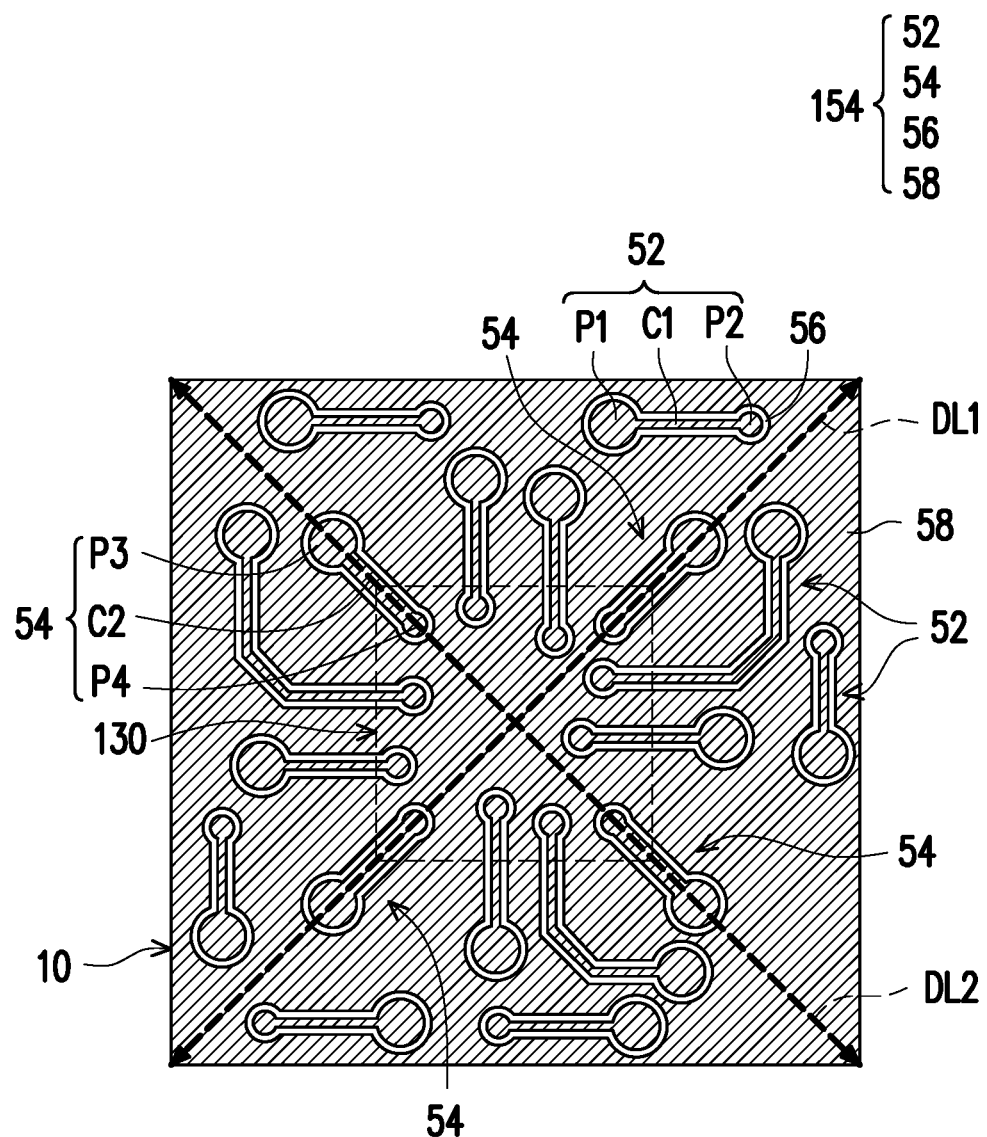
FIG. 12B, FIG. 13B, FIG. 14B, FIG. 15B, and FIG. 16B are schematic top views illustrating a relative position between second reinforcement structures and a semiconductor die of a package structure according to some exemplary embodiments of the present disclosure.
Figure 13B:
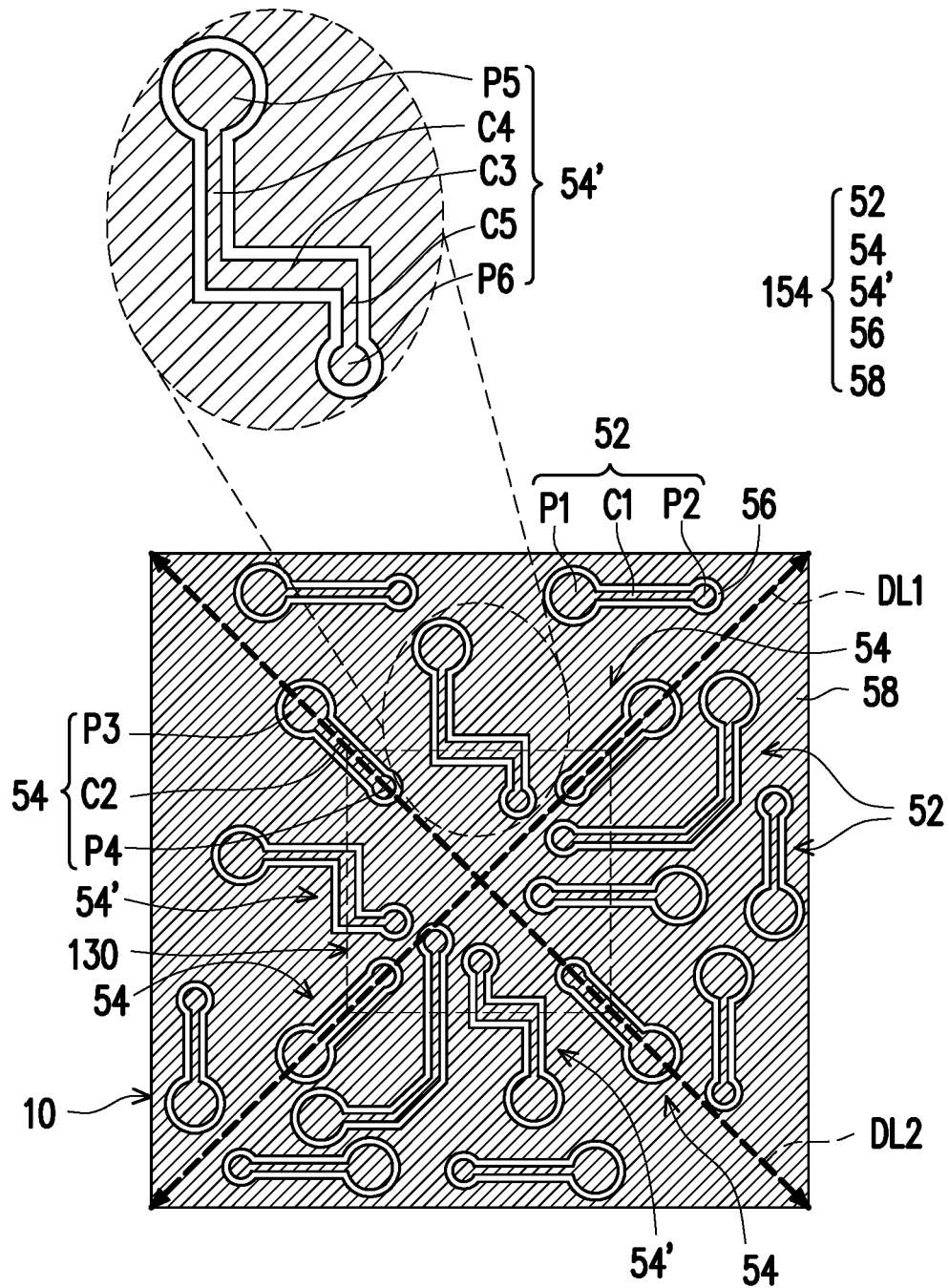
Figure 14B:
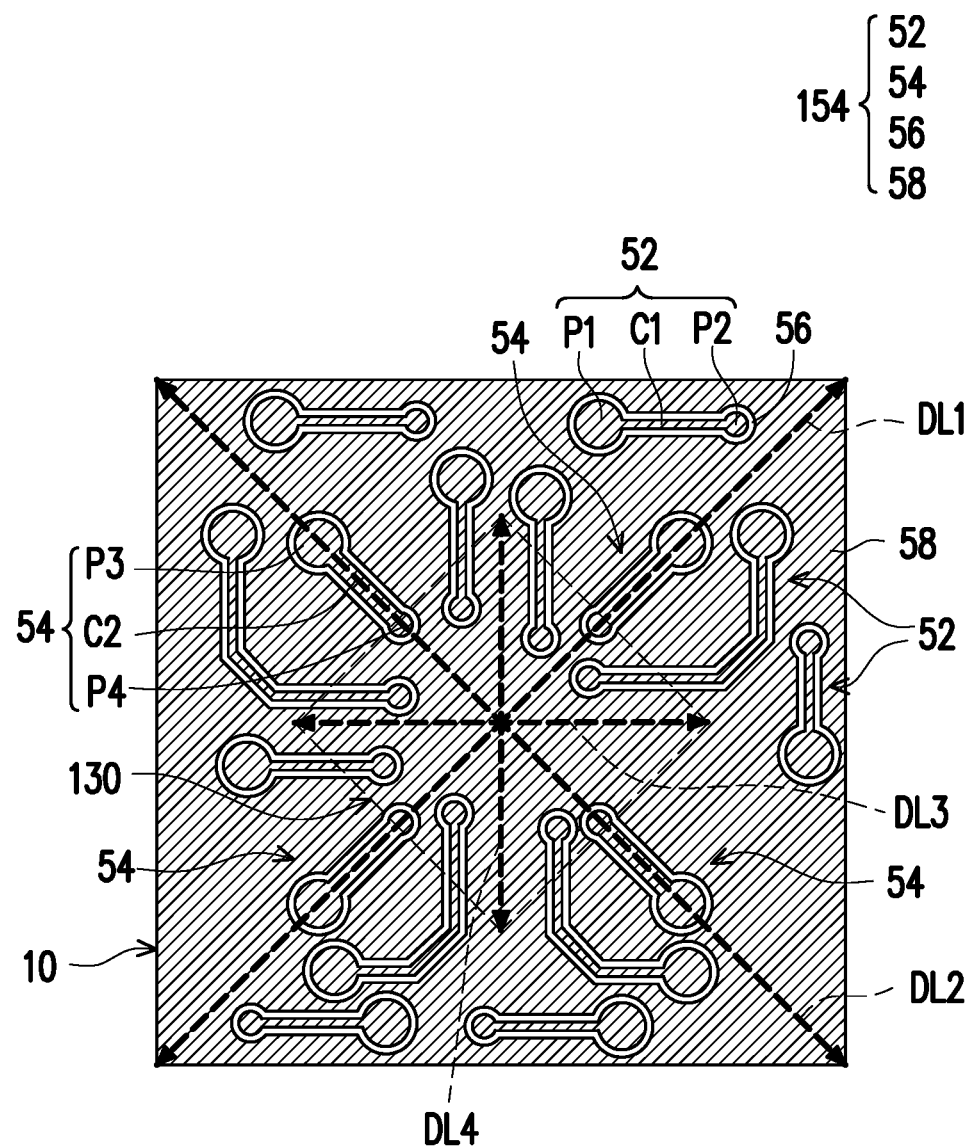
Figure 15B:
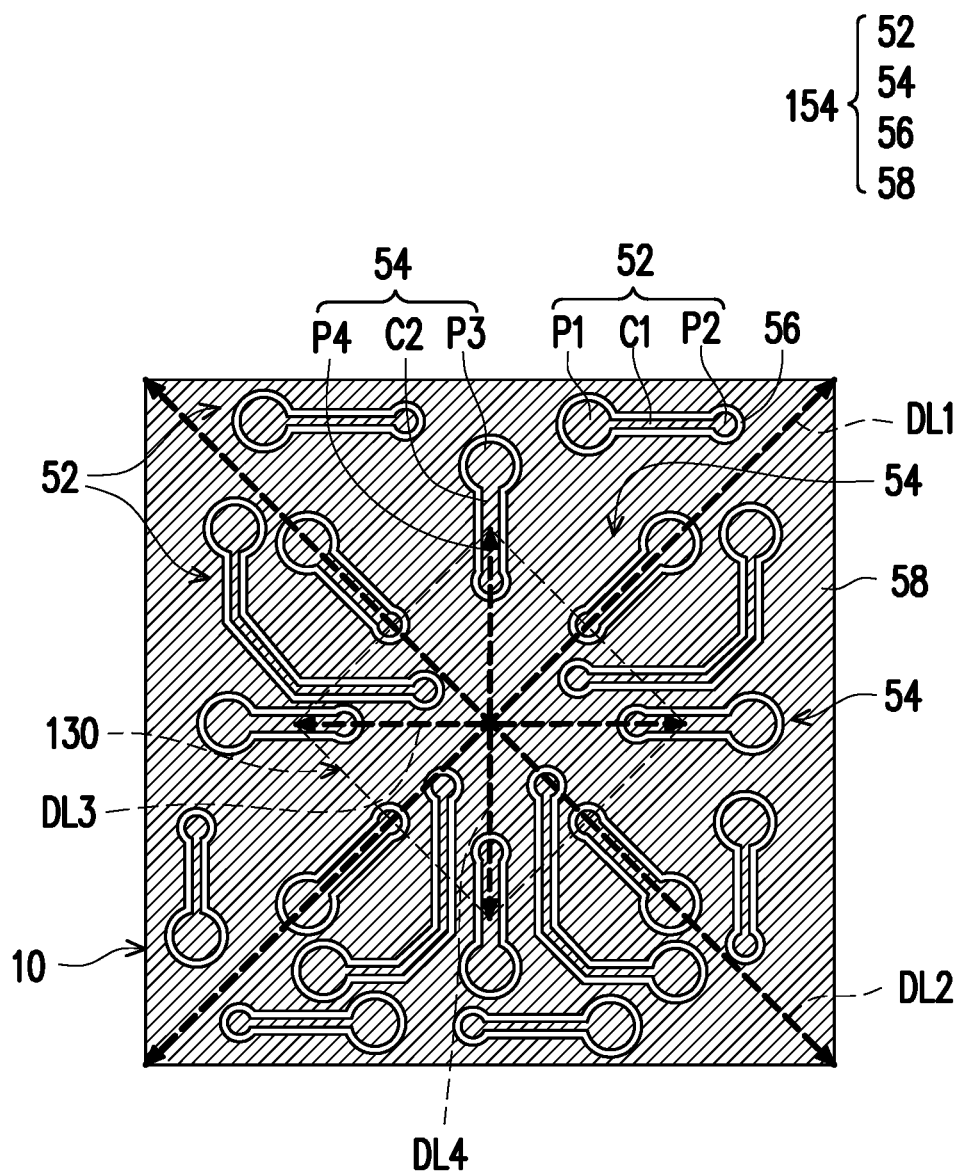
Figure 16B:
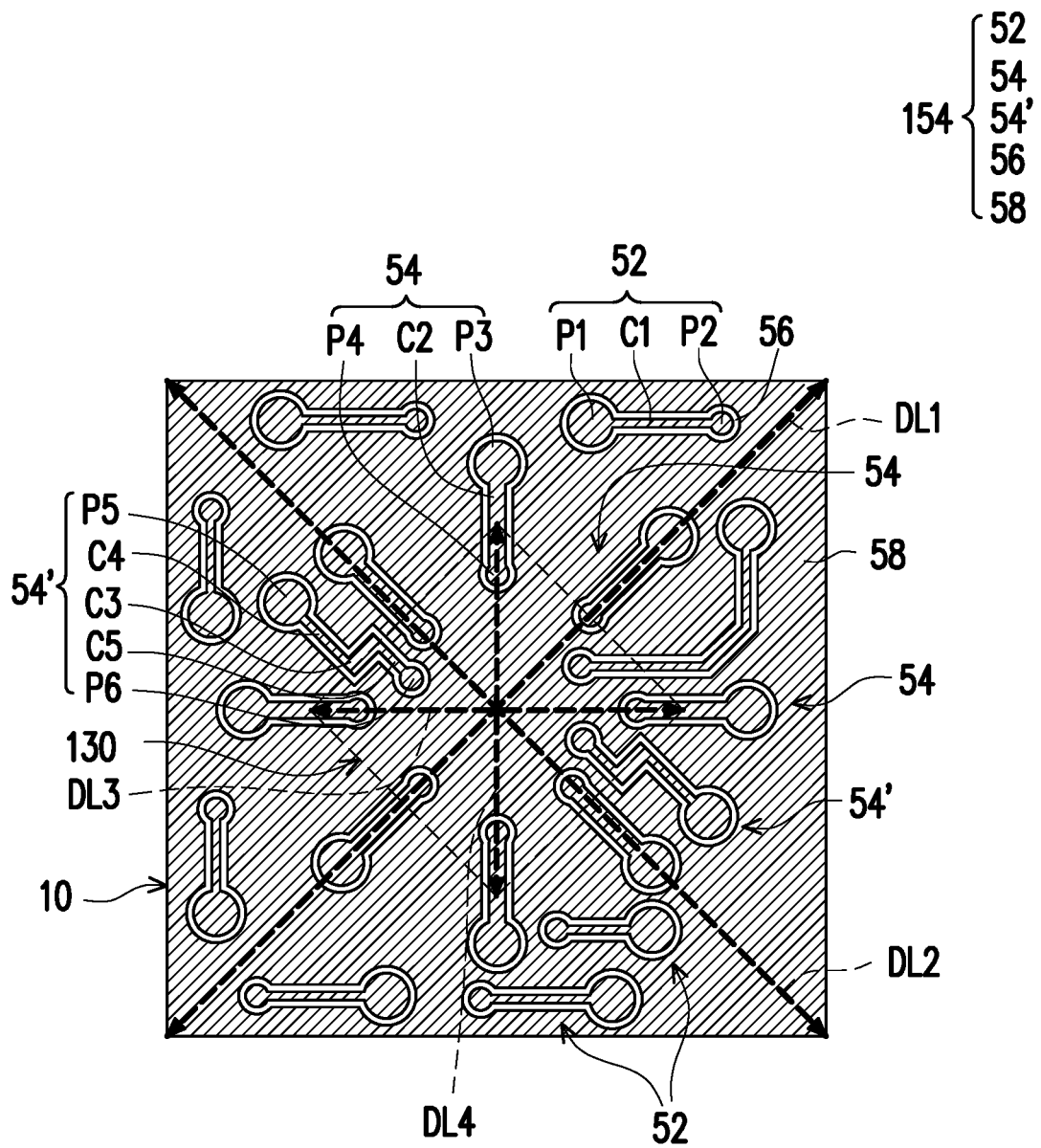

For example, as shown in FIG. 12B and FIG. 13B which the diagonal lines DL1, DL2 of the package structure 10 are respectively aligned with the diagonal lines (not labeled) of the semiconductor die 130, the conductive traces 54 are located on the diagonal lines DL1, DL2 of the package structure 10 and the respective one of the diagonal lines (not labeled) of the semiconductor die 130. For another example, as shown in FIG. 14B, FIG. 15B, and FIG. 16B which the diagonal lines DL1, DL2 of the package structure 10 are not aligned with the diagonal lines DL3, DL4 of the semiconductor die 130, some of the conductive traces 54 are located on the diagonal lines DL1, DL2 of the package structure 10 and some of the conductive traces 54 are located on the diagonal lines DL3, DL4 of the semiconductor die 130. For a further example, as shown in FIG. 13B and FIG. 16B, each of the conductive traces 54' is located on the edges of the semiconductor die 130 and across the interface of the semiconductor die 130 and the insulating encapsulation 140', where the connecting structures C3 of the conductive trace 54' are extending along the edges of the semiconductor die 130. Due to the connecting structures C2 and connecting structures C3, the stress applied to the conductive traces of the metallization layer 118b is suppressed, thereby the reliability of the package structure 10 is achieved, and thus the available area for routing design of the package structure 10 is increased.

In this disclosure, the numbers of the conductive traces 52, the conductive traces 54, and the conductive traces 54' are not limited to the drawings depicted in FIG. 12A to FIG. 16A and FIG. 12B to FIG. 16B, and may be selected based on the design layout and the demand. In some embodiments (not shown), for the redistribution circuit structure 118 and/or the redistribution circuit structure 150, some of the conductive traces 54 may be located on the edges of the semiconductor die 130 located with one or more than one of the conductive traces 54'. The disclosure is not limited thereto.

In accordance with some embodiments, a package structure includes an insulating encapsulation, at least one semiconductor die, a redistribution circuit structure, and first reinforcement structures. The at least one semiconductor die is encapsulated in the insulating encapsulation. The redistribution circuit structure is located on the insulating encapsulation and electrically connected to the at least one semiconductor die. The first reinforcement structures are embedded in the redistribution circuit structure. A shape of the package structure includes a polygonal shape on a vertical projection along a stacking direction of the insulating encapsulation and the redistribution circuit structure, and the first reinforcement structures are located on and extended along diagonal lines of the package structure.

In accordance with some embodiments, a package structure includes an insulating encapsulation, at least one semiconductor die, a first redistribution circuit structure, first reinforcement structures, a second redistribution circuit structure, and second reinforcement structures. The at least one semiconductor die is encapsulated in the insulating encapsulation. The first redistribution circuit structure is located on the insulating encapsulation and electrically connected to the at least one semiconductor die. The first reinforcement structures are electrically connected to and located in the first redistribution circuit structure. The second redistribution circuit structure is located on the insulating encapsulation and electrically connected to the at least one semiconductor die, wherein the insulating encapsulation is located between the first redistribution circuit structure and the second redistribution circuit structure. The second reinforcement structures are electrically connected to and located in the second redistribution circuit structure. The first redistribution circuit structure includes first conductive traces, the second redistribution circuit structure includes second conductive traces, and each of the first conductive traces and the second conductive traces includes a first contact pad, a second contact pad and a conductive structure connecting the first contact pad and the second contact pad, wherein a width of the first reinforcement structures is greater than a width of the conductive structures, and a width of the second reinforcement structures is greater than a width of the conductive structures.

In accordance with some embodiments, a method of manufacturing a package structure is provided with the following steps, forming a first redistribution circuit structure on a carrier, wherein forming the first redistribution circuit structure includes forming first conductive traces and second conductive traces on the carrier, each first conductive trace includes a first contact pad, a second contact pad and a first conductive structure connecting the first contact pad and the second contact pad, each second conductive trace includes a third contact pad, a fourth contact pad and a first reinforcement structure connecting the third contact pad and the fourth contact pad, and a width of the first reinforcement structures is greater than a width of the first conductive structures, wherein a shape of the package structure includes a polygonal shape on a vertical projection along a stacking direction of the first redistribution circuit structure and the carrier, and the first reinforcement structures are located on and extended along diagonal lines of the package structure; disposing at least one semiconductor die on the first redistribution circuit structure; and encapsulating the at least one semiconductor die in an insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
  a first redistribution structure and a second redistribution structure;
  a die, disposed between and electrically coupled to the first redistribution structure and the second redistribution structure;
  an insulating encapsulation, disposed between the first redistribution structure and the second redistribution structure and encapsulating the die;
  a first reinforcement structure, embedded in one of the first redistribution structure and the second redistribution structure and overlapped with the die and the insulating encapsulation in a vertical projection; and
  a first connecting structure, embedded in one of the first redistribution structure and the second redistribution structure and overlapped with the insulating encapsulation and offset from the die in the vertical projection,
  wherein a width of the first reinforcement structure is greater than the a width of the first connecting structure.

2. The package structure of claim 1, wherein the first reinforcement structure comprises:
  a first structure extends along a portion of an edge of the die;
  a second structure extends outward from a corner of the die; or
  a first structure extends along a portion of an edge of the die and a second structure extends outward from a corner of the die.

3. The package structure of claim 1, further comprising:
  a second reinforcement structure, embedded in other one of the first redistribution structure and the second redistribution structure and overlapped with the die and the insulating encapsulation in a vertical projection; and
  a second connecting structure, embedded in other one of the first redistribution structure and the second redistribution structure and overlapped with the insulating encapsulation and offset from the die in the vertical projection,
  wherein a width of the second reinforcement structure is greater than the a width of the second connecting structure.

4. The package structure of claim 3, wherein the second reinforcement structure comprises:
  a first structure extends along a portion of an edge of the die;
  a second structure extends outward from a corner of the die; or
  a first structure extends along a portion of an edge of the die and a second structure extends outward from a corner of the die.

5. The package structure of claim 1, further comprising at least one of:
  a plurality of conductive terminals, disposed on and connected to one of the first redistribution structure and the second redistribution structure; and
  at least one semiconductor device, disposed on and connected to one of the first redistribution structure and the second redistribution structure.

6. A package structure, comprising:
  a semiconductor die, disposed over a redistribution circuit structure;
  a reinforcement structure, embedded in the redistribution circuit structure, the reinforcement structure being partially overlapped with the semiconductor die, wherein the reinforcement structure extends along a portion of an edge of the semiconductor die; and
  a connecting structure, embedded in the redistribution circuit structure, wherein a projection of the connecting structure is laterally spacing from a projection of the semiconductor die, wherein in a vertical projection, a width of the reinforcement structure is greater than a width of the connecting structure.

7. The package structure of claim 6, wherein the reinforcement structure comprises a plurality of reinforcement structures each partially overlapped with the semiconductor die and respectively extends along a portion of each edge of the semiconductor die.

8. The package structure of claim 6, further comprising:
  at least another reinforcement structure, embedded in and electrically coupled to the redistribution circuit structure, the at least another reinforcement structure being partially overlapped with the semiconductor die, wherein the at least another reinforcement structure extends outward from a corner of the semiconductor die.

9. The package structure of claim 8, wherein in the vertical projection, a width of the at least another reinforcement structure is greater than the width of the connecting structure.

10. The package structure of claim 6, further comprising:
  an additional redistribution circuit structure, disposed over the semiconductor die; and a plurality of vertical connections, laterally spacing from the semiconductor die and electrically connecting the redistribution circuit structure and the additional redistribution circuit structure, wherein:

the redistribution circuit structure is connected to an active side of the semiconductor die, the additional redistribution circuit structure is connected to a rear side of the semiconductor die, and the rear side is opposite to the active side along a stacking direction of the redistribution circuit structure and the semiconductor die, and the additional redistribution circuit structure is electrically coupled to the semiconductor die through the redistribution circuit structure and the plurality of vertical connections.

11. The package structure of claim 6, further comprising:

an additional redistribution circuit structure, disposed over the semiconductor die; and a plurality of vertical connections, laterally spacing from the semiconductor die and electrically connecting the redistribution circuit structure and the additional redistribution circuit structure, wherein:

the redistribution circuit structure is connected to a rear side of the semiconductor die, the additional redistribution circuit structure is connected to an active side of the semiconductor die, and the rear side is opposite to the active side along a stacking direction of the redistribution circuit structure and the semiconductor die, and the redistribution circuit structure is electrically coupled to the semiconductor die through the additional redistribution circuit structure and the plurality of vertical connections.

12. The package structure of claim 6, further comprising:

an additional redistribution circuit structure, disposed over the semiconductor die;

an additional reinforcement structure, embedded in the additional redistribution circuit structure, the additional reinforcement structure being partially overlapped with the semiconductor die;

an additional connecting structure, embedded in the additional redistribution circuit structure, wherein a projection of the additional connecting structure is laterally spacing from the projection of the semiconductor die, wherein in the vertical projection, a width of the additional reinforcement structure is greater than a width of the additional connecting structure; and a plurality of vertical connections, laterally spacing from the semiconductor die and electrically connecting the redistribution circuit structure and the additional redistribution circuit structure, wherein one of the redistribution circuit structure and the additional redistribution circuit structure is electrically coupled to the semiconductor die through the plurality of vertical connections and other one of the redistribution circuit structure and the additional redistribution circuit structure.

13. The package structure of claim 12, wherein the additional reinforcement structure comprise:

a first reinforcement structure extends along a portion of another edge of the semiconductor die;

a second reinforcement structure extends outward from a corner of the semiconductor die; or a first reinforcement structure extends along a portion of another edge of the semiconductor die and a second reinforcement structure extends outward from a corner of the semiconductor die.

14. A package structure, comprising:

a first redistribution structure;

a die, disposed over and electrically coupled to the first redistribution structure;

an insulating encapsulation, encapsulating the die;

a first reinforcement structure, embedded in the first redistribution structure and overlapped with the die and the insulating encapsulation in a vertical projection;

a first connecting structure, embedded in the first redistribution structure and overlapped with the insulating encapsulation and offset from the die in the vertical projection, wherein a width of the first reinforcement structure is greater than the a width of the first connecting structure;

an antenna element, disposed over the first redistribution structure and electrically coupled to the die; and an encapsulant, disposed between the antenna element and the die.

15. The package structure of claim 14, wherein the first reinforcement structure comprises:

a first structure extends along a portion of an edge of the die;

a second structure extends outward from a corner of the die; or a first structure extends along a portion of an edge of the die and a second structure extends outward from a corner of the die.

16. The package structure of claim 14, further comprising:

a second redistribution structure, disposed over the die, wherein the insulating encapsulation is interposed between the first redistribution structure and the second redistribution structure;

a plurality of conductive pillars, next to the die and penetrating through the insulating encapsulation, the plurality of conductive pillars electrically connecting the first redistribution structure and the second redistribution structure;

a second reinforcement structure, embedded in other one of the first redistribution structure and the second redistribution structure and overlapped with the die and the insulating encapsulation in a vertical projection; and a second connecting structure, embedded in other one of the first redistribution structure and the second redistribution structure and overlapped with the insulating encapsulation and offset from the die in the vertical projection, wherein a width of the second reinforcement structure is greater than the a width of the second connecting structure.

17. The package structure of claim 16, wherein the second reinforcement structure comprises:

a first structure extends along a portion of an edge of the die;

a second structure extends outward from a corner of the die; or a first structure extends along a portion of an edge of the die and a second structure extends outward from a corner of the die.

18. The package structure of claim 14, further comprising at least one of:

a plurality of conductive terminals, disposed on and connected to one of the first redistribution structure and the second redistribution structure; and at least one semiconductor device, disposed on and connected to one of the first redistribution structure and the second redistribution structure.

19. The package structure of claim 14, wherein the antenna element is a patch antenna.

20. The package structure of claim 14, further comprising:

a plurality of dipole antennas, arranged along the periphery of the package structure and next to the die, wherein the plurality of dipole antennas are embedded in the insulating encapsulation and electrically coupled to the die.

* * * * *